United States Patent
Burgun et al.

(10) Patent No.: US 6,301,553 B1
(45) Date of Patent: Oct. 9, 2001

(54) METHOD AND APPARATUS FOR REMOVING TIMING HAZARDS IN A CIRCUIT DESIGN

(76) Inventors: Luc M. Burgun, 4, rue du Barrage, Creteil (FR), 94000; Frederic M. Emirian, 8, rue de Chatillon, Paris (FR), 75014

( * ) Notice: Subject to any disclaimer, the term of this patent is extended or adjusted under 35 U.S.C. 154(b) by 0 days.

(21) Appl. No.: 09/184,841

(22) Filed: Nov. 2, 1998

Related U.S. Application Data

(63) Continuation-in-part of application No. 08/980,419, filed on Nov. 26, 1997, now Pat. No. 5,831,866, which is a continuation of application No. 08/655,843, filed on May 31, 1996, now Pat. No. 5,801,955.

(51) Int. Cl.[7] .................................................... G06F 17/50
(52) U.S. Cl. ................. 703/15; 703/23; 703/19; 716/6; 714/724
(58) Field of Search ................. 703/15, 23, 19; 716/6; 714/724

(56) References Cited

U.S. PATENT DOCUMENTS

| | | | |
|---|---|---|---|
| 5,377,334 | 12/1994 | Boldt et al. | 395/325 |
| 5,452,239 | 9/1995 | Dai et al. | 364/578 |
| 5,455,931 * | 10/1995 | Camporese et al. | 395/550 |
| 5,493,505 | 2/1996 | Banerjee et al. | 364/488 |
| 5,517,506 | 5/1996 | Underwood et al. | 371/27 |
| 5,583,787 | 12/1996 | Underwood et al. | 364/489 |
| 5,831,866 * | 11/1998 | Burgun et al. | 364/488 |
| 5,886,904 * | 3/1999 | Dai et al. | 364/578 |
| 6,020,760 * | 1/2000 | Sample et al. | 326/41 |

* cited by examiner

Primary Examiner—Kevin J. Teska
Assistant Examiner—Phai Phan
(74) Attorney, Agent, or Firm—Columbia IP Law Group, PC.

(57) ABSTRACT

An apparatus is programmed to automatically remove timing hazards from a circuit design. The apparatus identifies certain level sensitive storage circuit elements in the circuit design. The identified level sensitive storage circuit elements are those having timing hazards. The timing hazards arise as a result of potential skews between the reference signal for the circuit design and the synchronization signal controlling each storage circuit element. A skew, introduced by a gated or divided clock, cannot be assured to be within a design tolerance limit. Therefore, the program enables the apparatus to transform the identified level sensitive storage circuit elements into level sensitive storage circuit elements controlled by synchronization signals that do not have potential skews with respect to the reference signal of the circuit design. The transformation, however, is accomplished without altering the functionality of the circuit design. In effect, the apparatus automatically removes some or all of the timing hazards by determining the appropriate transformation for each of the identified level sensitive storage circuit elements.

25 Claims, 26 Drawing Sheets

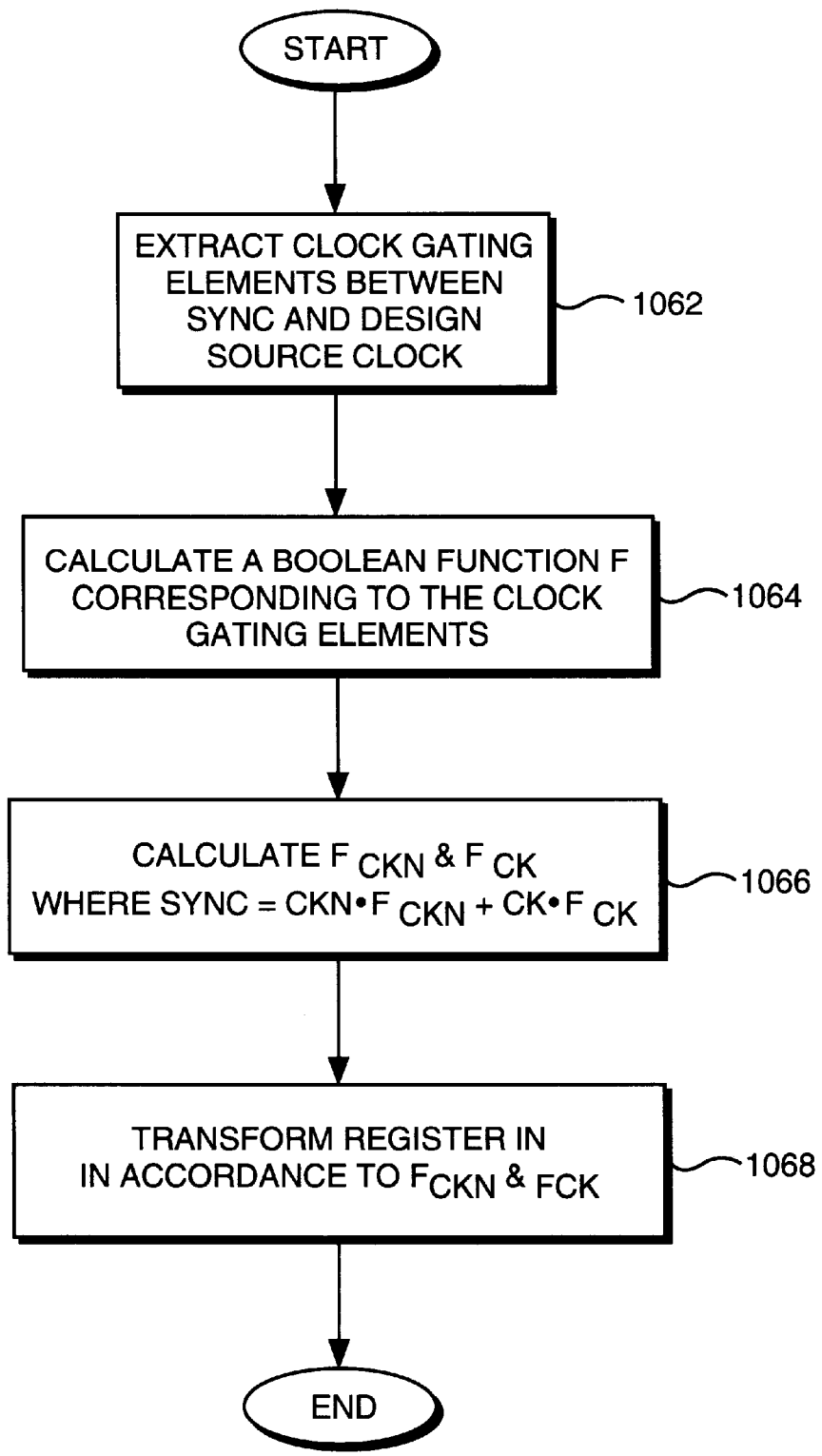

FIG. 8

| CASE | $F_{CKN}$ | $F_{CK}$ | SYNC |
|---|---|---|---|
| 1 | 0 | 0 | 0 |
| 2 | 1 | 0 | CKN |
| 3 | X | 0 | CKN • $F_{CKN}$ |
| 4 | 0 | 1 | CK |
| 5 | 1 | 1 | 1 |
| 6 | X | 1 | $F_{CKN}$ + CK |
| 7 | 0 | X | CK • $F_{CK}$ |
| 8 | 1 | X | CKN + $F_{CK}$ |
| 9 | X | X | $F_{CKN}$ • CKN + $F_{CK}$ • CK |

METHOD AND APPARATUS FOR REMOVING TIMING HAZARDS IN A CIRCUIT DESIGN

RELATED APPLICATIONS

This application is a continuation-in-part of application Ser. No. 08/980,419, filed on Nov. 26, 1997 now U.S. Pat. No. 5,831,866, which is a continuation of Ser. No. 08/655,843, filed on May 31, 1996 now U.S. Pat. No. 5,801,955, having a common inventor and having the same assignee as this application.

BACKGROUND OF THE INVENTION

1. Field of the Invention

The present invention relates to the field of circuit designs. More specifically, the present invention relates to the art of dealing with timing hazards when designing or validating circuits including level-sensitive storage circuit elements.

2. Background Information

In synchronous sequential circuits, the storage circuit elements (or registers) are basically controlled (or synchronized) by a periodic clock signal called the design source clock. The design source clock is very often combined with logic to generate derived clock signals such as gated or divided clocks. These derived clocks signals drive the input clock pin of the registers. The correct operation of the synchronous sequential circuit depends primarily on the fact that only transitions by the design source clock signal can cause register outputs to switch. Furthermore, when the design is implemented in hardware, the clock delay between the design source clock input and the input clock pins of the registers of the circuit must respect certain design tolerance constraints. More specifically, the clock skew, i.e. the difference between the input clock pin delay for two distinct registers, must be less than the time required to propagate data between these two registers. Otherwise, race conditions may be reached that will cause timing hazards such as hold time violations.

These timing hazard problems present themselves when designing or validating circuits in, for instance, cycle based simulation, hardware acceleration, and hardware emulation. The timing hazard problems are especially acute for hardware emulation, which is often employed to validate circuit designs prior to first silicon. Hardware emulation decreases the design development time by allowing a "real-time" verification ten thousand to one million times faster than software logic simulation. Thus, hardware emulation has become increasingly popular as complexity of circuit designs and the pressure to reduce time to market continue to increase.

A typical hardware emulation system includes a reconfigurable hardware emulator and circuit design "mapping" software which produces a hardware implementation of the circuit design to be emulated onto the hardware emulator system. This "mapping" software includes netlist translation, synthesis and technology mapping, and partitioning and routing for multiple electronically reprogrammable circuit based architectures, so that the mapping software can automatically produce a configuration file. The configuration file is downloaded to the hardware emulator to configure the emulator into a hardware prototype of the design. Unfortunately, all hardware emulators have limitations that constrain their performance. One of the most important problems involves meeting fundamental timing requirements of the original design, such as ensuring a minimal clock skew between registers controlled by clock signals directly connected or derived from the same design source clock input. Minimal clock skew ensures that a design operates properly by preventing hold time violations due to short paths between registers (latches or edge triggered flip-flops).

Existing hardware emulators typically provide a clock distribution network with zero-skew so that every register which is directly connected to such a distribution network can be clocked with a minimal clock skew. In existing hardware emulators, the design source clock signal is implemented by the clock distribution network so that the registers directly connected to the design source clock signal can behave properly, that is, without any hold time violations. The implementation of the design source clock by the clock distribution network will be referred to as "the master clock."

When a clock is derived (gated or divided), the derived clock can no longer be routed over the clock distribution network. As a result, the minimal clock skew can no longer be guaranteed. Three techniques are commonly employed to solve this problem:

1) Hand patching of the original design to remove the gated and divided clocks.

2) Timing analysis of potential hold time violations and introduction of additional delays between registers after the partitioning and routing steps.

3) Pulling of the gated and divided clocks to the source of the clock distribution network.

These techniques suffer a number of drawbacks. The first technique is both time consuming and error prone. The second technique involves recompiling the design and may produce significant transformations in the circuit design, which in turn may result in new potential hold time violations and may lead to a time consuming compilation loop. The last technique is limited by the number of clock signals routed over the clock distribution network.

More recently, a new approach has been used to automatically solve the gated clock problem in the case of flip-flops that are controlled by a particular combinatorial logic gate set. In this approach, the structure of the gated clock combinatorial logic is identified. Then, the combinatorial logic is transformed so that the respective flip-flop is directly controlled by the master clock and the combinatorial logic provides a separate enable signal to the flip-flop. This approach, however, depends heavily on the way in which the clock signal is generated, i.e. the structure of the combinatorial logic. Furthermore, this approach is not applicable in the case of level sensitive storage circuit elements (i.e. latches).

As will be disclosed in more detail below, the present invention provides a new automated approach to remove timing hazards from a circuit design. The invention overcomes the prior art disadvantages, and provides a number of desirable advantages, which will be readily apparent to those skilled in the art. The invention is especially adaptable for use in a hardware emulator, although the invention is similarly applicable to cycle based simulation, hardware acceleration, etc.

SUMMARY OF THE INVENTION

An apparatus is programmed to automatically remove timing hazards from a circuit design. The apparatus identifies certain level sensitive storage circuit elements in the circuit design. The identified level sensitive storage circuit elements are those having timing hazards. The timing hazards arise as a result of skew, i.e. the difference in delay between the input clock pins of registers (one or both being a level sensitive storage circuit element). A skew, introduced by a gated or divided clock, cannot be assured to be within a design tolerance limit. Therefore, the program enables the apparatus to transform the identified level sensitive storage circuit elements so that each is directly controlled by the design source clock signal. Since the design source clock signal is mapped onto the clock distribution network, the apparatus allows the level sensitive storage circuit elements to behave properly. The transformation, however, is accomplished without altering the functionality of the circuit design. In effect, the apparatus automatically removes some or all of the timing hazards by determining the appropriate transformation for each of the identified level sensitive storage circuit elements. The apparatus can also be viewed as a way to minimize the number of clock signals within a design without altering the functionality.

BRIEF DESCRIPTION OF DRAWINGS

The present invention will be described by way of embodiments, but not limitations, illustrated in the accompanying drawings in which like references denote similar elements, and in which:

FIGS. 7 and 8 illustrate one embodiment of the gated clock timing hazard resolution method steps of the present invention;

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As understood by those skilled in the art, these quantities take the form of electrical, magnetic, or optical signals capable of being stored, transferred, combined, and otherwise manipulated through mechanical and electrical components of the computer system; and the term computer system includes general purpose as well as special purpose data processing machines, systems, and the like, that are standalone, adjunct or embedded.

Various operations will be described as multiple discrete steps in turn in a manner that is most helpful in understanding the present invention. However, the order of description should not be construed as to imply that these operations are necessarily order dependent, in particular, the order of presentation.

Figure 1:
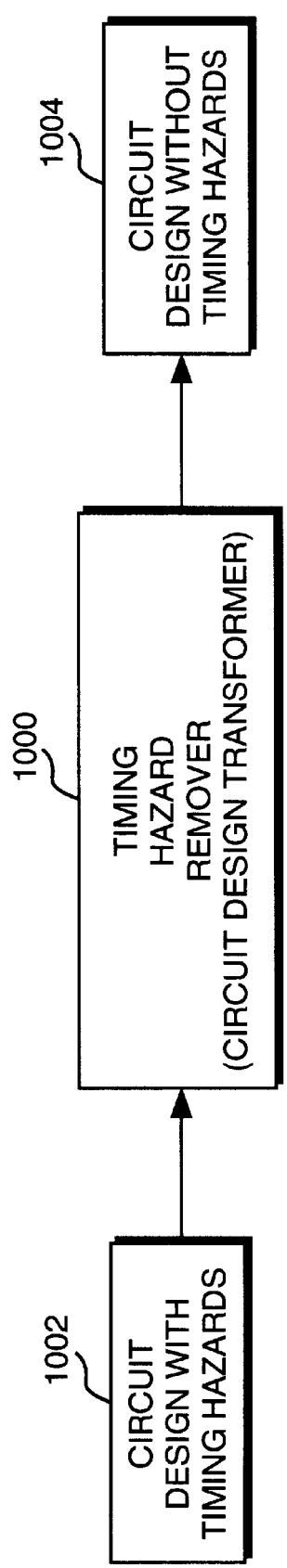
FIG. 1 illustrates an overview of the present invention.

Referring now to FIG. 1, wherein an overview of the present invention is illustrated. Shown is timing hazard remover 1000 of the present invention receiving circuit design 1002 as input, circuit design 1002 having timing hazards, processing the circuit design at the gate level, automatically detecting and removing the timing hazards from the circuit design, and then outputting circuit design 1004 with timing hazards removed. An example of circuit design 1002 is a synchronous sequential circuit having a number of registers (edge triggered flipflops and/or level sensitive latches or memories), and controlled by a periodic design source clock. Typically, the gate level design comprises a hierarchy or flattened gate-level netlist representing the circuit to be simulated. The various signals in a design are referred to as nets. A hierarchical netlist is made of a list of blocks, whereas a flattened netlist comprises only one block. A block contains components and a description of their interconnection using nets. Components can be reduced to combinatorial or sequential logic gates, or they may be hierarchical blocks of lower level. For example, components making up a gate level design may include primitive gates, such as AND, NAND, NOR, etc., or storage elements such as flipflops and latches. One example of a generic library of gate level components is GTECH, available from Synopsys, Inc. of Mountain View, Calif.

Examples of timing hazards in gate level designs include clock gating hazards and clock division hazards, to be more fully described below. Circuit design 1002 may include multiple levels of these timing hazards. Circuit design 1002 may be represented in any one of a number of machine readable manners well known in the art.

In one embodiment, timing hazard remover 1000 is a computer system programmed with logic for automatically removing clock gating and clock division timing hazards from a circuit design. As will be described in more detail below, timing hazard remover 1000 automatically removes timing hazards by transforming the registers in the circuit design. A computer system may be programmed with the logic in a variety of manners known in the art, including but not limited to representing the logic in executable instructions, and storing the executable instructions in a storage medium for execution by an execution unit of the computer system during operation. In one adaptation, the computer system is a component of a hardware emulation system, and the logic for removing timing hazards is programmed as an integral part of programming the computer system with logic for compiling and mapping the circuit design onto the logic and interconnect elements of the hardware emulation system.

Before we describe timing hazard remover 1000 in further detail, we will first describe clock gating and clock division timing hazards in more detail, including multi-level timing hazards.

Figure 2A:
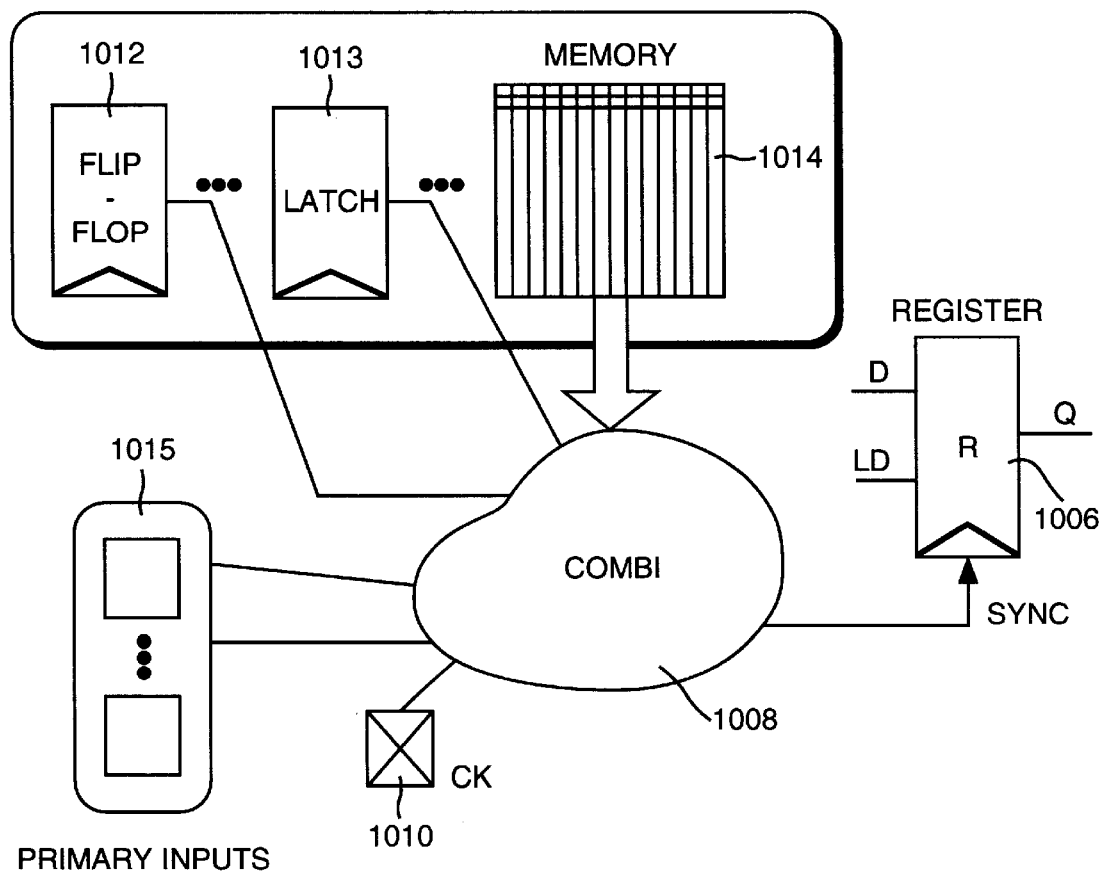
FIGS. 2a–2b illustrate the general case and a simple case of clock gating timing hazards.
Figure 2B:
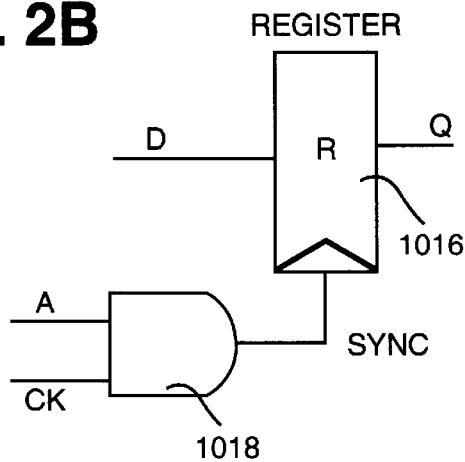

FIGS. 2a–2b illustrate the general case and a simple case of a clock gating timing hazard respectively. As shown in FIG. 2a, register 1006 is clocked by a synchronization SYNC signal (hereinafter simply SYNC signal), which is generated by combinatorial logic 1008 based on a reference design source clock CK 1010 (hereinafter simply design source clock CK), outputs from other flip-flops 1012, latches 1013, memories 1014 and primary inputs 1015. As a result of a hardware emulation, the amount of clock delay at the input clock pin for the SYNC signal (with respect to design source clock CK) may be different than the delay at other registers from which register 1006 receives input D or to which register 1006 provides output Q. This skew between delays cannot be guaranteed to be within the design tolerance limit. Obviously, in various variations of this general case, register 1006 may not have enable control signal LD, combinatorial logic 1008 may be very simple or very complex, combinatorial logic 1008 may use many flip-flop outputs and/or primary inputs, or may use only one of these outputs/inputs in its generation of SYNC. As shown in FIG. 2b, combinatorial logic 1008 may simply be an AND gate 1018, which generates the SYNC signal based only on the design source clock CK and one other input A (which could either be a register output or a primary input).

Figure 3A:
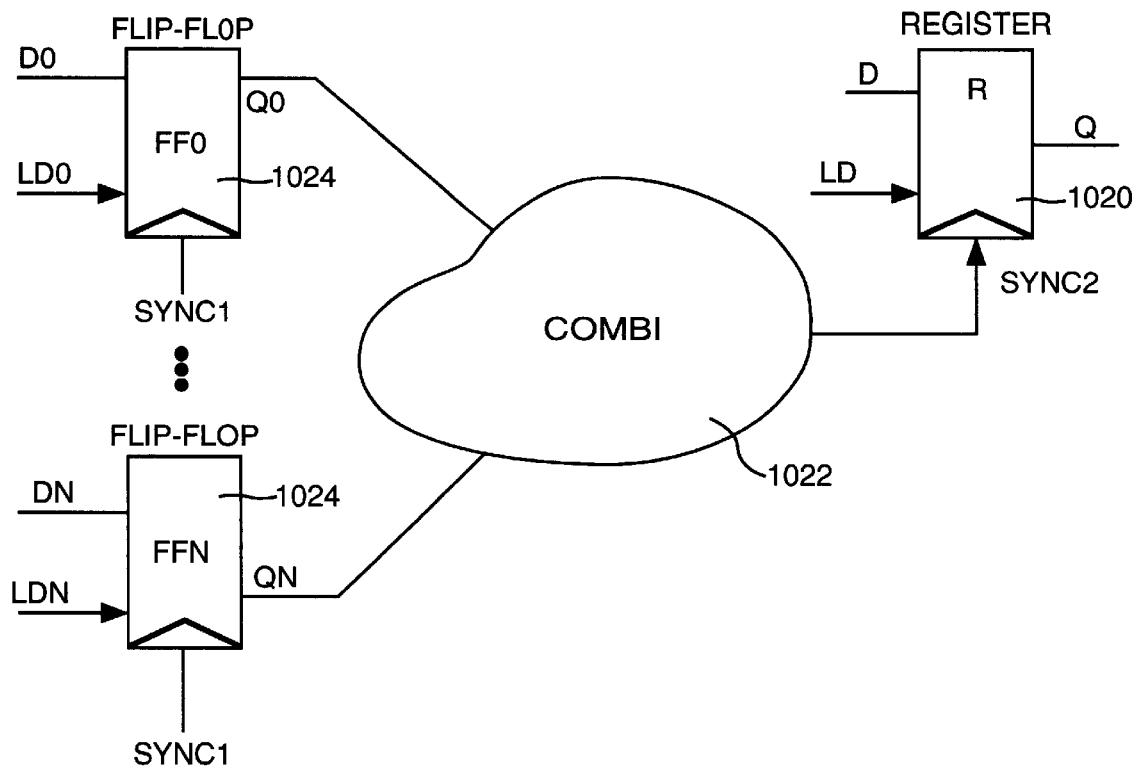
FIGS. 3a–3b illustrate the general case and a simple case of clock dividing timing hazards.
Figure 3B:
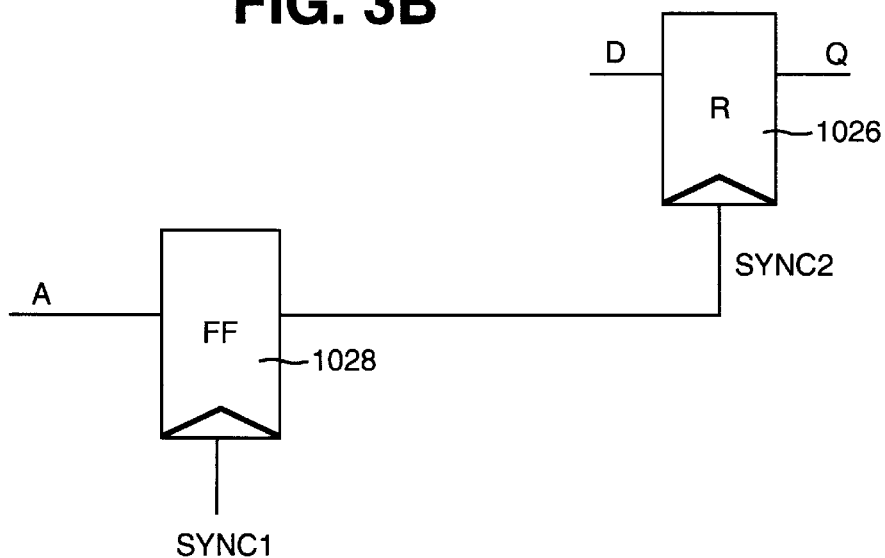

FIGS. 3a–3b illustrate the general case and a simple case of clock division timing hazard respectively. As shown in FIG. 3a, register 1020 is clocked by a SYNC2 signal, which is generated by combinatorial logic 1022 based on outputs from flip-flops 1024 clocked by a SYNC1 signal. As a result, even if SYNC1 is the design source clock and not a derivative clock, the amount of clock skew between SYNC2 and the synchronization signal for another register which depends on register 1020 or on which register 1020 depends cannot be guaranteed to be within the design tolerance limit. Obviously, in various variations of this general case, register 1020 and flip-flops 1024 may not have enable control signals LD, LD0–LDn, combinatorial logic 1022 may be very simple or very complex, combinatorial logic 1022 may use many or only one flip-flop output in its generation of SYNC2, and SYNC1 may simply be CK or derived from CK. As shown in FIG. 3b, combinatorial logic 1022 may even be null. In other words, register 1026 maybe controlled by SYNC2, which is the output of flip-flop 1028, which is controlled by SYNC1.

Figure 4:
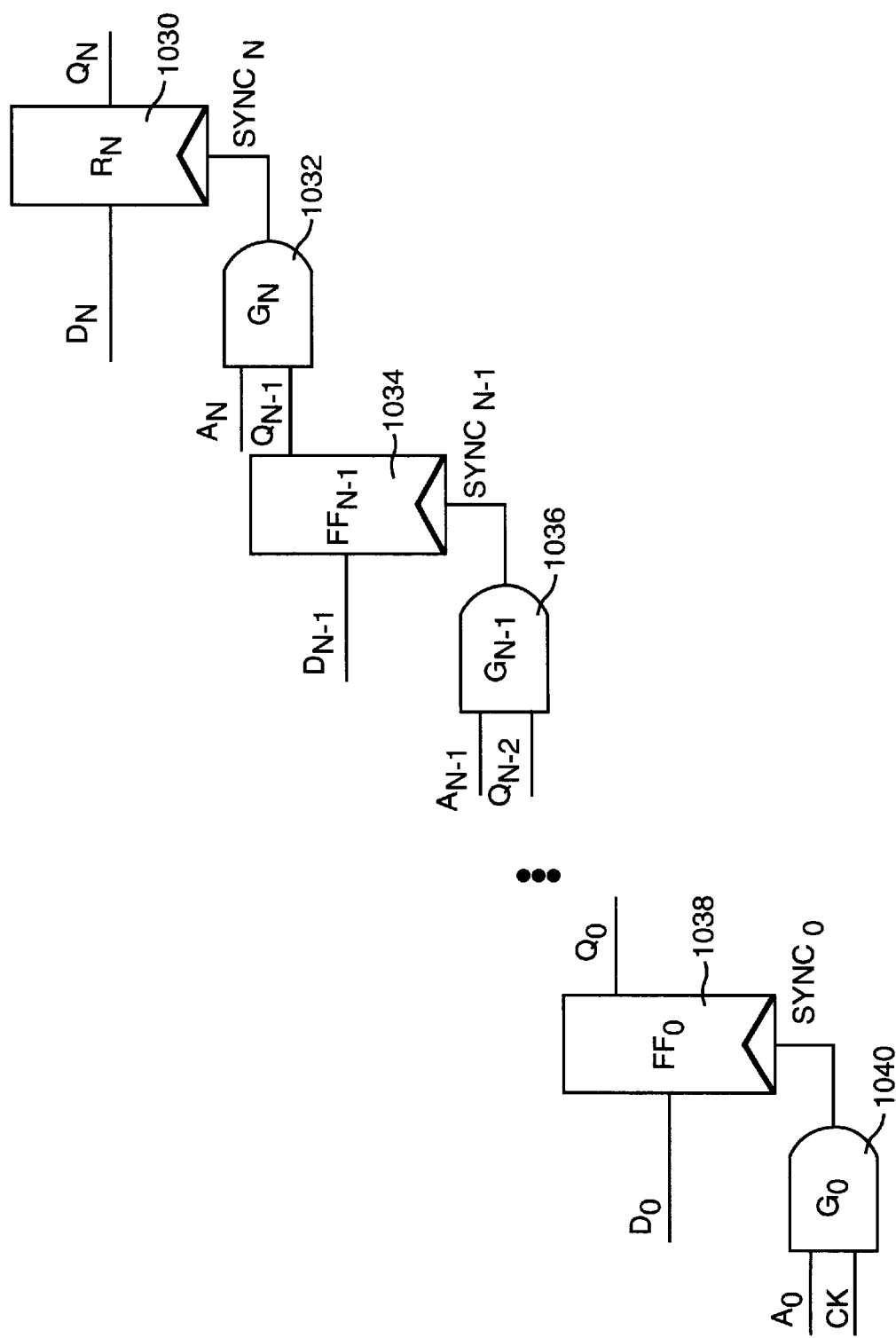
FIG. 4 illustrates an example of multi-level timing hazards.

FIG. 4 illustrates one example of multi-level timing hazards.

Register FFn 1030 is controlled by gated SYNCn signal generated by gate Gn 1032. One of the inputs ($Q_{n-1}$) employed by gate Gn 1032 is output by a flip-flop FFn-1 1034, which in turn is controlled by another gated $SYNC_{n-1}$ signal generated by another gate Gn-1 1036. The other input (An) employed by gate Gn 1032 is derived from lower level flip-flops synchronized by (ck, SYNC0, . . . , $SYNC_{n-1}$). The pattern continues until ultimately n levels later signal $Q_0$ is output by flip-flop FF0 1038 controlled by gated $SYNC_0$ signal, which is generated by gate G0 1040 using the design source clock CK as one of its inputs, and input $A_0$ as the other input. For convenience, we shall refer to the flip-flops clocked by the master clock as flip-flops situated at level 0, the flip-flops clocked by the outputs of the flip-flops of level 0 to be situated at level 1, and so forth. In other words, in general, flip-flops situated at level N+1 are clocked by outputs of flip-flops situated at level N or less than N.

Having now described clock gating and clock division schemes, we will now describe timing hazard remover 1000 in more detail.

Figure 5:
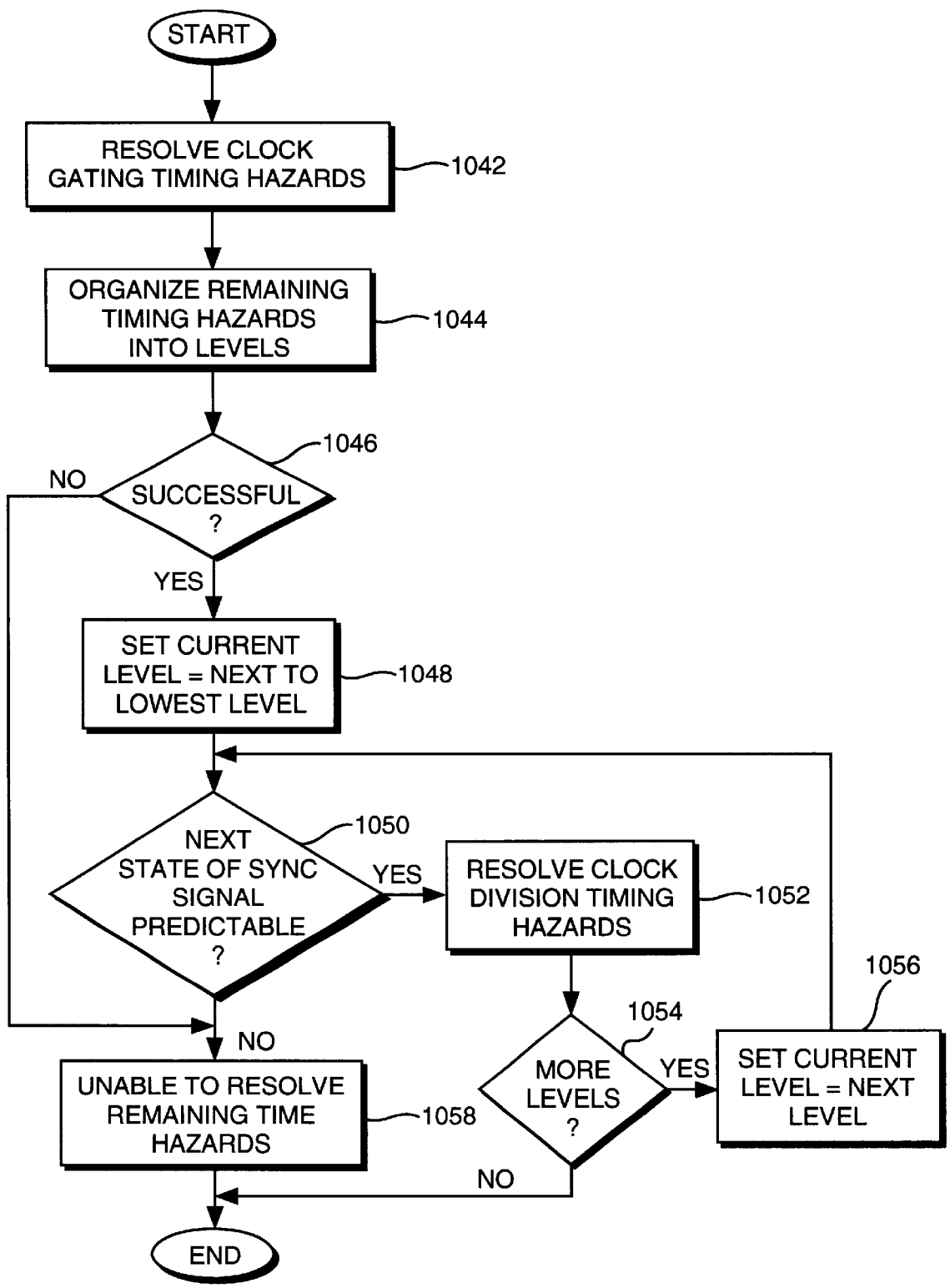
FIG. 5 illustrates one embodiment of the overall method steps of the present invention.

FIG. 5 illustrates the method steps of one embodiment of timing hazard remover 1000. As shown, during operation, timing hazard remover 1000 first resolves clock gating timing hazards in a circuit design, step 1042. Upon resolving all the clock gating timing hazards in the circuit design, which will be described in more detail below, timing hazard remover 1000 logically organizes the clock division timing hazards into levels, step 1044. If timing hazard remover 1000 is successful in organizing the clock division timing hazards into levels, step 1046, timing hazard remover 1000 then proceeds to resolve the clock division timing hazards, which will also be described in more detail below, steps 1048–1056. On the other hand, if timing hazard remover 1000 is unable to organizes the clock division timing hazards into levels, it terminates operation, steps 1046 and 1058.

At step 1048, timing hazard remover 1000 sets the current level to the next to lowest level, i.e. the first level of SYNC signals output by flip-flops directly controlled by the design source clock. Timing hazard remover 1000 then determines whether the next state of each SYNC signal is predictable, step 1050. If the next state of each SYNC signal is predictable, timing hazard remover 1000 proceeds to resolve the clock division timing hazards, step 1052. On the other hand, if the next state of at least one SYNC signal is not predictable, timing hazard remover 1000 terminates operation, step 1058.

Upon resolving all clock division timing hazards for the current level, timing hazard remover 1000 determines if there are still additional levels of clock division timing hazards to be resolved, step 1054. If the determination is affirmative, timing hazard remover 1000 sets the current level to the next level, step 1056, and repeats steps 1050–1054 again. The process continues until it encounters a level wherein the next state has at least one SYNC signal which is not predictable, step 1050, or until clock division timing hazards have been resolved for all levels, step 1054.

Timing hazard remover 1000 will not be successful in logically organizing the clock division timing hazards into multiple logical levels if a synchronization signal depends on itself. This problem is known to those skilled in the art as a synchronization loop. The next state of a synchronization loop is unpredictable if an external primary input, a latch output or a memory output is connected to the clock dividing combinatorial logic generating the synchronization signal.

Figure 6A:
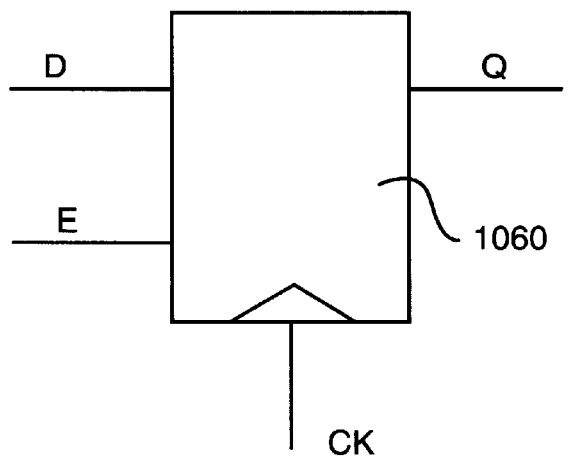
FIGS. 6a–6b illustrate the target register and its equivalent employed to resolve timing hazards in accordance to the present invention.
Figure 6B:
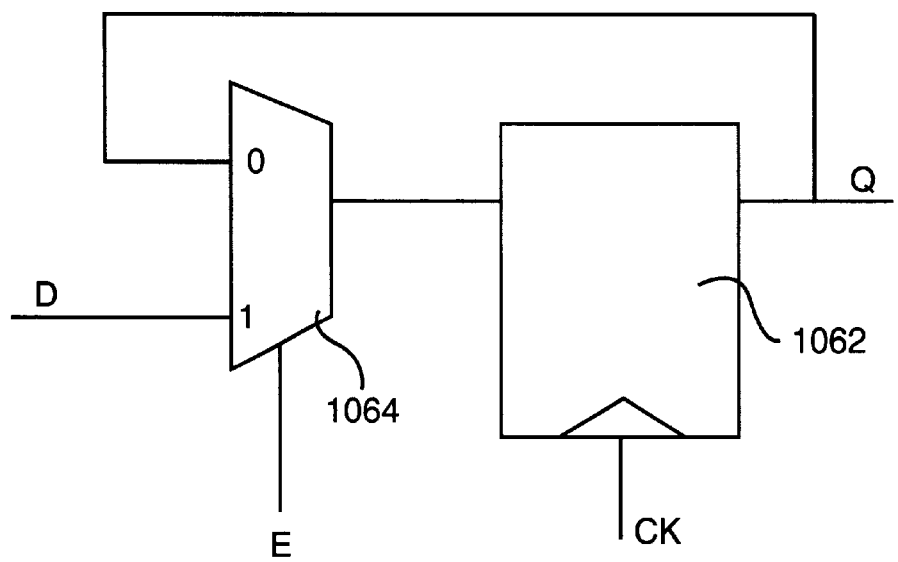

As described earlier, timing hazard remover 1000 resolves clock gating and clock division timing hazards by transforming the registers. More specifically, timing hazard remover 1000 transforms the registers controlled by gated/divided clocks into registers controlled by the design source clock and a complementary enable control. Before we proceed to describe these transformation operations in further detail, it should be noted that a register (edge triggered flip-flop or a level sensitive latch) controlled by a clock operating in conjunction with a multiplexer controlled by an enable signal may be made functionally equivalent to a register controlled by the same clock and a complementary enable control. FIG. 6a illustrates a register 1060 controlled by a clock and a complementary enable control, whereas FIG. 6b illustrates a register 1062 controlled by a clock, operating in conjunction with a multiplexer 1064 controlled by an enable signal. As it is apparent to those skilled in art, by providing the D input of register 1062 with a selected one of either the current state (feedback) or the next state of the D input using multiplexer 1064 as shown, register 1062 operating in conjunction with multiplexer 1064 is functionally equivalent to register 1060.

FIG. 7 in conjunction with FIG. 8 illustrate the transformation steps performed by one embodiment of timing hazard remover 1000 to resolve a clock gating timing hazard. As shown in FIG. 7, timing hazard remover 1000 first extracts clock gating elements between the SYNC signal and the design source clock in step 1062. This step is described in more detail below with respect to FIG. 25. Next, timing hazard remover 1000 calculates a Boolean function F corresponding to the clock gating elements of the clock gating timing hazard, step 1064. In one embodiment, a canonical representation of F is constructed using the well known Reduced Ordering Binary Decision Diagram (ROBDD). In alternate embodiments, a truth table representation of F, which is another canonical representation, could be used. Next, timing hazard remover 1000 calculates $F_{ckn}$ and $F_{ck}$, step 1066, where SYNC=CkN . $F_{ckn}$+Ck. $F_{ck}$, and $F_{ckn}$ and $F_{ck}$ are the cofactors of F with respect to Ck, and equal to F(Ck=0) and F(Ck=1) respectively. (CKN stands for the Boolean complement of CK.) The relationship between SYNC, CK, $F_{ckn}$ and $F_{ck}$ is specified by the well known Shannon's formula. Then, timing hazard remover 1000 transforms the registers in accordance to the values determined for $F_{ckn}$ and $F_{ck}$, step 1068. $F_{ckn}$ and $F_{ck}$ can take the value 0, 1, or X, where X stands for non-constant functions.

To determine if a Boolean function is equal to 1 (tautology checking) or 0 (antilogy checking) is well known in the art. In one embodiment, it can be solved by computing a canonical representation such as ROBDD.

FIG. 8 illustrates the various values $F_{ckn\ and\ Fck}$ can take on. There are nine possible pairs of values {0, 0}, {1, 0}, {X, 0} etc. FIG. 8 also shows the corresponding value for SYNC for each of the nine cases. The method of FIG. 7 and the table shown in FIG. 8 apply to gated clock timing hazards for both edge triggered registers, such as flip-flops, and level sensitive registers, such as latches. The transformations are not all the same, however, for edge triggered and level sensitive registers. Gated clock transformations for level sensitive registers are discussed below with respect to FIGS. 19–21.

Figure 9A:
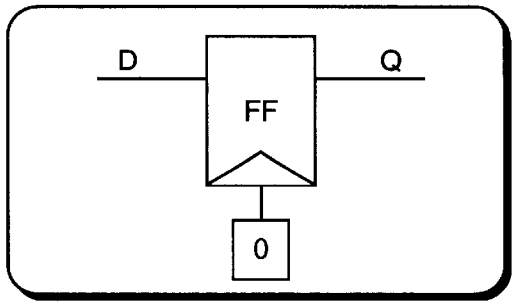
FIGS. 9a–9i illustrate gated clock transformations for edge triggered registers (flip-flops)

FIGS. 9a–9i illustrate the corresponding transformations performed for each of the nine cases for edge triggered flip-flops. For example, when $F_{ckn}$ and $F_{ck}$ are determined to be {0, 0} (case 1), since SYNC is suppose to always equal to zero, the flip-flop controlled by SYNC is transformed into a flip-flop controlled by the constant logic value zero (without a complementary enable control) (FIG. 9a).

Figure 9B:
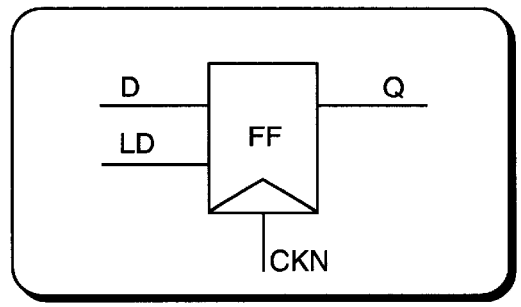
Figure 9C:
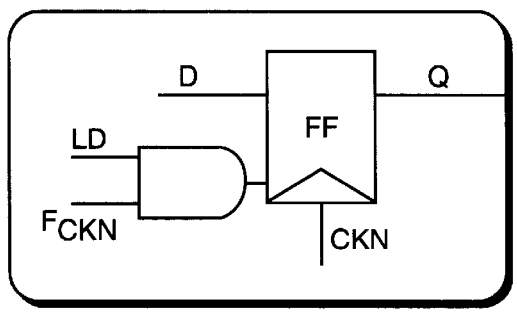
Figure 9D:
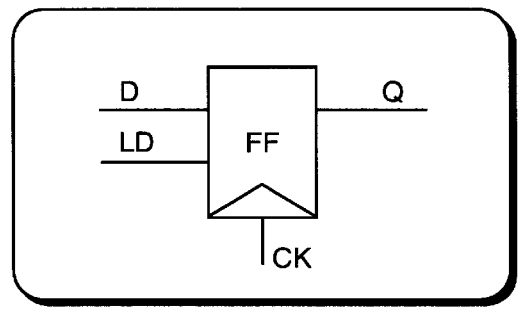
Figure 9E:
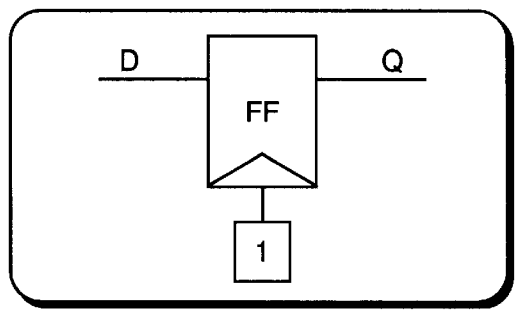

When $F_{ckn}$ and $F_{ck}$ are determined to be {1, 0} (case 2), since SYNC is suppose to be equal to Ckn, the flip-flop controlled by SYNC is transformed into a flip-flop controlled by the inverted design source clock, which in turn is complemented by the original enable control signal LD only (FIG. 9b). (SYNC is not dependent on either cofactor.) When $F_{ckn}$ and $F_{ck}$ are determined to be {X, 056 (case 3), since SYNC is suppose to equal to CkN AND $F_{ckn}$, the flip-flop controlled by SYNC is transformed into a flip-flop controlled by the inverted design source clock, complemented by an enable control which is $F_{ck}$ qualified by the original enable control LD (FIG. 9c), and so forth. The fact that case one and case five employ the constant logic value zero and one respectively is not a problem, because by virtue of their constancy, there is no excessive clock skew problem, and therefore no potential timing hazards.

The most complicated case is case nine, where $F_{ckn}$ and $F_{ck}$ are determined to be {X, X}. In that case, the clock gating combinatorial logic is replaced by a multiplexer controlled by a divided clock for selecting either $F_{ckn}$ for $F_{ck}$, as SYNC. (LD is unmodified.) The divided clock will have the same frequency as the design source clock. The divided clock is derived by introducing a generated clock that is twice as fast as the design source clock, and dividing the double frequency clock. The new clock division timing hazard and LD are in turn resolved subsequently with the other clock division timing hazards, in steps 1044–1058 in FIG. 5.

In sum, timing hazard remover 1000 resolves clock gating timing hazards by transforming each flip-flop controlled by a gated clock into a flip-flop controlled by either the design source clock of the circuit design, the inverted design source clock, the design source clock multiplied by two, or a constant logic value (0, 1).

The clocking control is complemented as appropriate by an enable control. The clocking control, the employment of complementary enable control, and if employed, the enable control are determined using a representation for a Boolean function corresponding to the clock gating circuit elements, and factoring into consideration whether the original flip-flop has an enable input or not. In some cases, depending on the complementary enable control employed, the programmed computer system further inserts an AND gate into the circuit design accordingly, to provide the appropriate complementary enable control.

Figure 10:
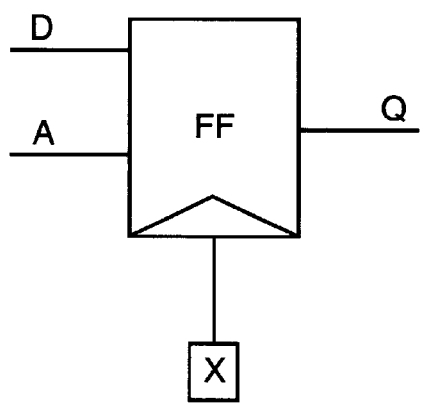
FIG. 10 illustrates the transformed register from FIG. 2b wherein the register is edge triggered.

FIG. 10 illustrates the transformed flip-flop for the simple clock gating timing hazard case illustrated in FIG. 2b. Recall from FIG. 2b, the clock gating combinatorial logic simply includes a single AND gate, thus the corresponding Boolean function F is F=A AND Ck. Therefore, $F_{ckn}$ and $F_{ck}$ equal 0 and X respectively, i.e. case 7 of FIG. 8. Thus, the original flip-flop clocked by SYNC is transformed into a flip-flop clocked by the design source clock Ck, and complemented by $F_{ck}$, which is equal to A (Ck=1). Since the original flip-flop did not have an enable control LD, $F_{ck}$, which is A in the instant example, is provided to the transformed flip-flop without "qualification", therefore resulting in the illustrated flip-flop.

Skipping now to FIGS. 19a–19i, wherein nine gated clock transformations are shown for a level sensitive register. In the illustrated embodiments, the level sensitive register is a latch. In other embodiments, similar transformations may be employed for memories. FIGS. 19a–19i correspond to the nine cases respectively of the Boolean function F, shown in FIG. 8.

Figure 9F:
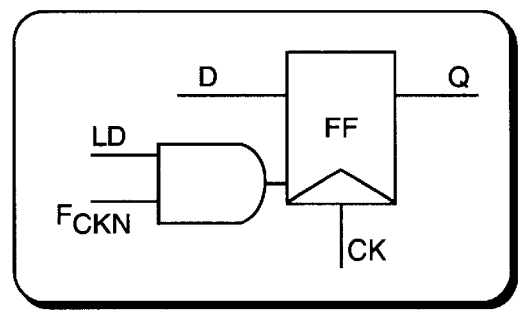
Figure 9G:
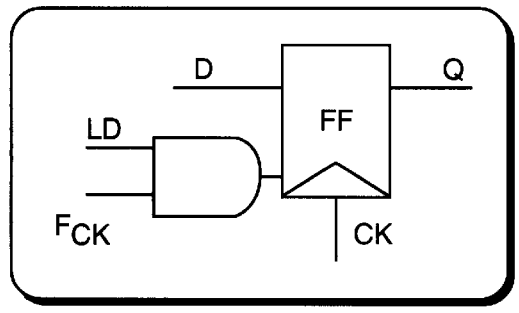
Figure 9H:
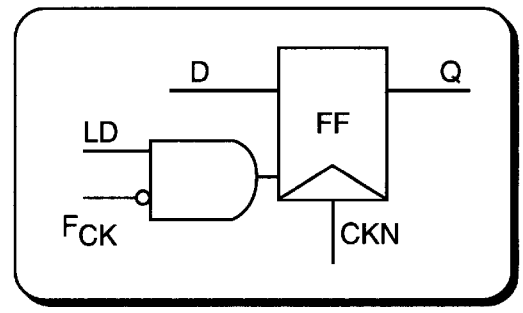
Figure 9I:
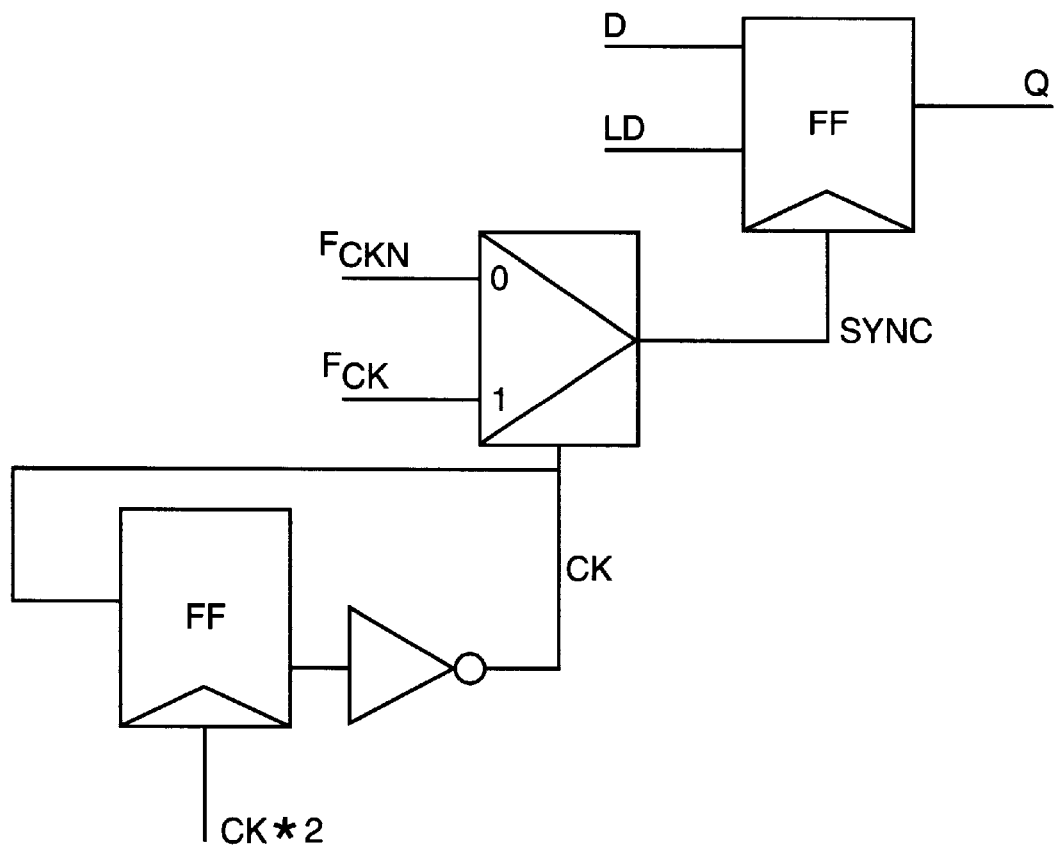
Figure 19A:
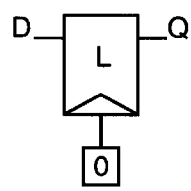
FIGS. 19a–19i illustrate one embodiment of gated clock timing hazard transformations for level sensitive registers (latches)
Figure 19B:
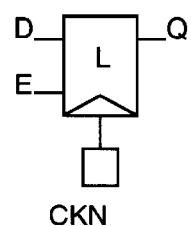
Figure 19C:
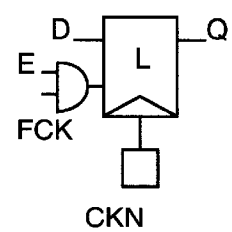
Figure 19D:
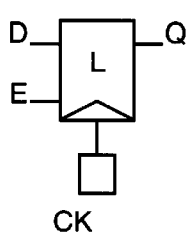
Figure 19E:
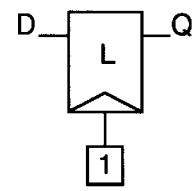
Figure 19F:
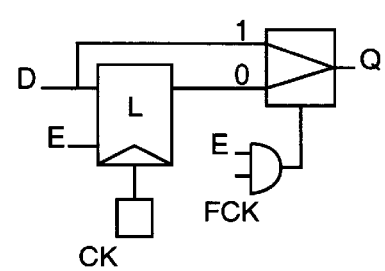
Figure 19G:
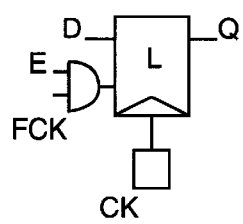
Figure 19H:
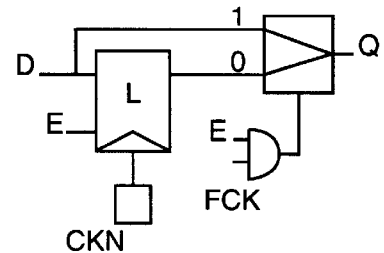

The level sensitive latch transformations shown in FIGS. 19f and 19h differ from the corresponding transformations for an edge triggered flip-flop shown in FIGS. 9f and 9h. The differences account for the different operational characteristics of the latch and the flip-flop. The output of a level sensitive register can change as long as SYNC is at the proper level. For instance, an active high latch will pass the D input through to the Q output as long as SYNC is high. That is, while SYNC is high, Q will follow D. When SYNC is low, the output will not change so that the last value on D at the time SYNC went low is "latched." The output of the edge triggered flip-flop, in contrast, can only transition once in response to a SYNC transition. For instance, Q can only transition on rising clock edges.

Figure 20:
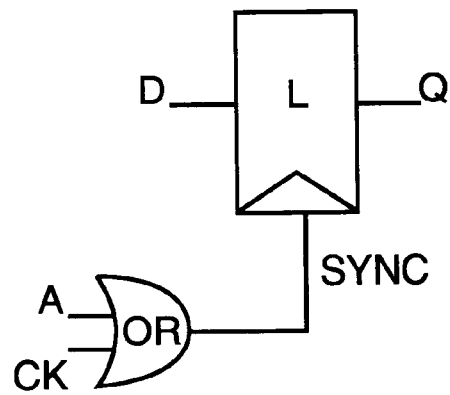
FIG. 20 illustrates an example of a gated clock timing hazard for a level sensitive register.

FIG. 20 illustrates a simple example of a gated clock timing hazard for a level sensitive latch. In this example, the gating combinatorial logic includes a single OR gate. When A is 0, SYNC equals Ck. So, whenever Ck is high, Q follows D. When A is 1, SYNC equals 1, so that Q follows D irrespective of Ck. The corresponding Boolean function F is F=A OR Ck. When Ck=0, F=A. A is an indeterminate variable, indicated by X in FIG. 8. When Ck=1, F =1. Therefore, $F_{ckn}$ and $F_{ck}$ are X and 1 respectively, which is case 6 of FIG. 8. Case 6 corresponds to FIG. 19f.

Figure 21:
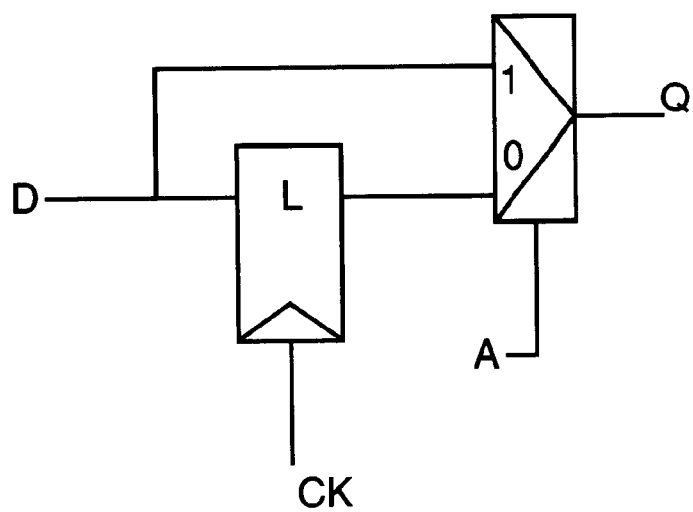
FIG. 21 illustrates one embodiment of the transformed register of FIG. 20.

Accordingly, the transformation is shown in FIG. 21. The original latch did not have an enable control E. Therefore, the transformed latch does not qualify the multiplexer select input by ANDing with E. Rather, the multiplexer is controlled directly by $F_{ckn}$, which is equal to A in this case. The transformed latch performs exactly like the original latch. When A is 1, Q follows D. When A is 0, Q follows D only when Ck is high.

Figure 19I:
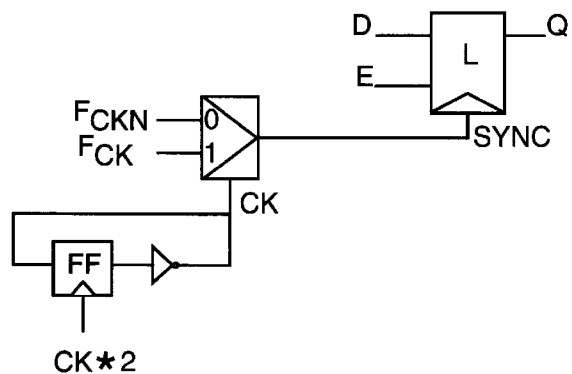

As with the edge triggered flip-flop, the most complicated latch transformation is for case nine, where $F_{ckn}$ and $F_{ck}$ are determined to be {X, X}, as shown in FIG. 19i. As with the edge triggered flip-flop, the combinatorial logic cannot be transformed to eliminate the timing hazard. Instead, the gated clock timing hazard is transformed into a divided clock timing hazard. Then, the timing hazard will be resolved as a divided clock as discussed below with respect to FIGS. 27–29.

In sum, as with the edge triggered flip-flop, timing hazard remover 1000 resolves clock gating timing hazards by transforming level sensitive registers controlled by a gated clock into level sensitive registers controlled by one of the design source clock of the circuit, the inverted design source clock, the design source clock multiplied by two, or a constant logic value (0,1). The clocking control is complemented as appropriate by an enable control E. Some transformations for the level sensitive register differ from the transformations for the edge triggered flip-flop to account for the different operational characteristics of each. For instance, in cases 6 and 8, the output of the latch is multiplexed with the input of the latch so that the output can change according to the level of the original SYNC signal, as opposed to changing in response to clock edges.

Next, we will discuss resolving divided clock timing hazards. Divided clock timing hazards are resolved differently for edge trigger registers and level sensitive registers. Resolving divided clock timing hazards for level sensitive registers will be discussed below with respect to FIGS. 22–24.

Figure 11:
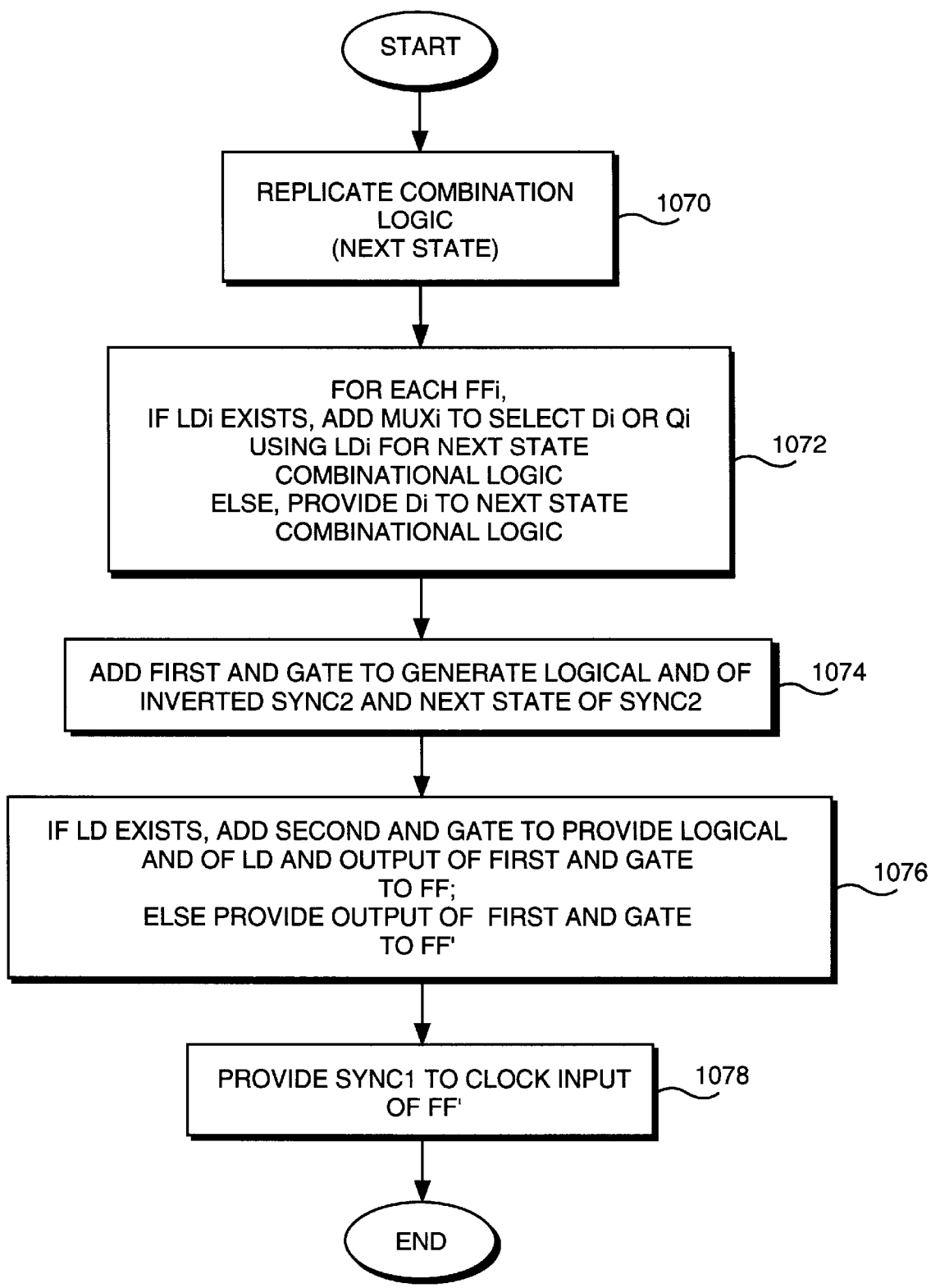
FIGS. 11–13 illustrate one embodiment of the clock division timing hazard resolution method steps of the present invention for edge triggered registers.
Figure 12:
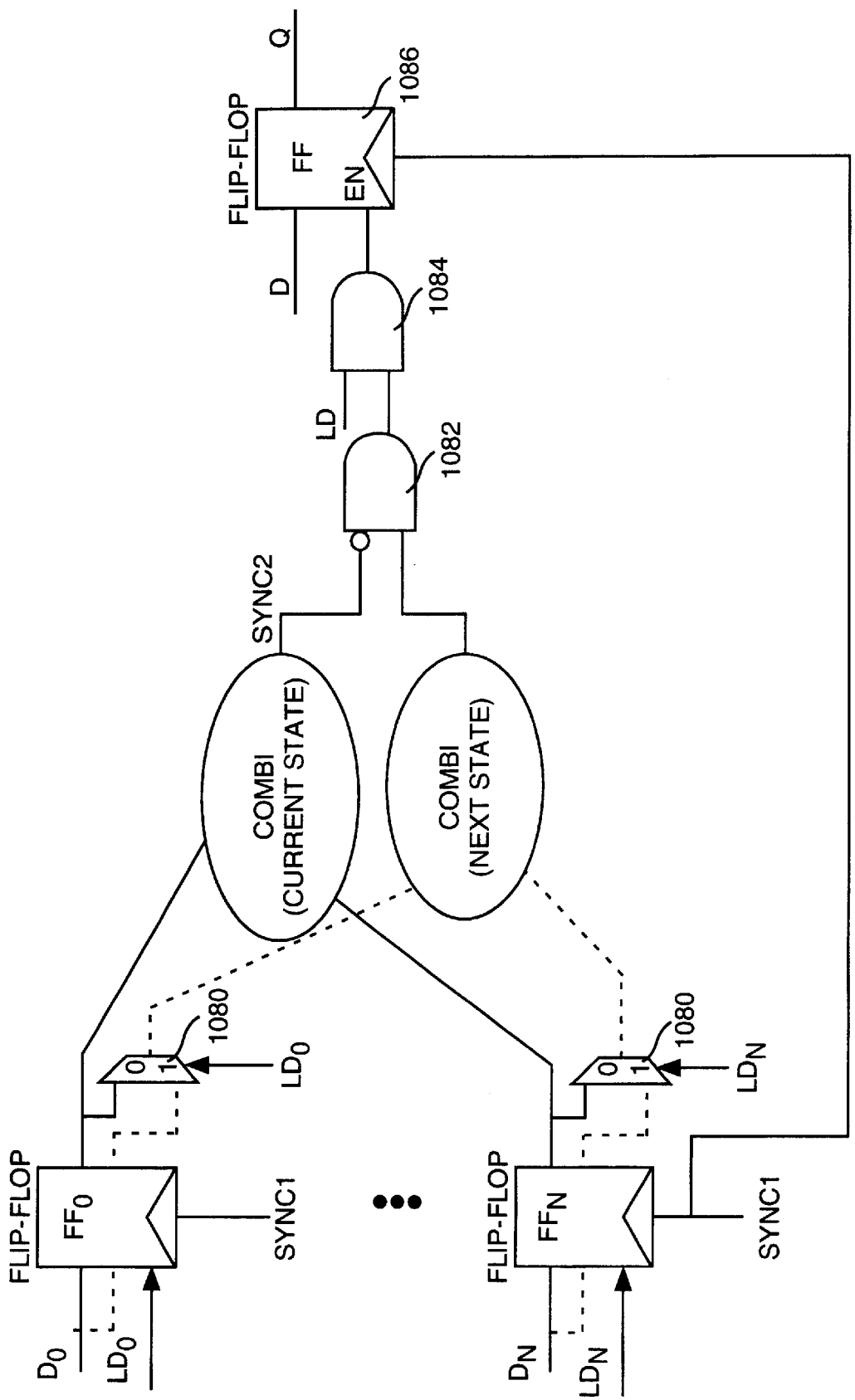

Referring back now to FIGS. 11–12, wherein together the figures illustrate the transformation steps performed by one embodiment of timing hazard remover to resolve a clock division timing hazard for an edge triggered flip-flop. As shown in FIG. 11, timing hazard remover 1000 first replicates the timing dividing combinatorial logic, step 1070. Next, for each flip-flop that outputs for the clock dividing combinatorial logic, if the outputting flip-flop has an enable control LD, timing hazard remover 1000 inserts a corresponding multiplexer (1080 of FIG. 12) controlled by the original enable control LD to select either the current state (Qi) or the next state (Di) of the outputting flip-flop to output for the replicated clock dividing combinatorial logic; otherwise, timing hazard remover 1000 couples the next state (Di) of the outputting flip-flop to output for the replicated clock dividing combinatorial logic, step 1072.

Then, timing hazard remover 1000 inserts a first AND gate (1082 of FIG. 12) to generate a logical AND of inverted SYNC2 and the next state of SYNC2, step 1074. If the original flip-flop has an enable control LD, timing hazard remover 1000 further inserts a second AND gate (1084 of FIG. 12) to qualify the output of first AND gate 1082 for transformed flip-flop (1086 of FIG. 12), otherwise, timing hazard remover 1000 provides the output of first AND gate 1082 to transformed flip-flop 1086 without "qualification". Lastly, timing hazard remover 1000 couples SYNC1 to the clock input transformed flip-fop 1086, step 1078.

In sum, timing hazard remover 1000 resolves clock division timing hazards by transforming each flip-flop controlled by a divided clock into a flip-flop controlled by the "parent" undivided clock and a complementary enable control. Timing hazard remover 1000 further inserts an AND gate into the circuit design to generate the complementary enable control using an inverted version and a predictive version of the divided clock. Timing hazard remover 1000 further inserts a replicated copy of the intervening clock dividing elements to generate the predictive version of the divided clock. Lastly, timing hazard remover 1000 further inserts a multiplexer for each input providing flip-flop coupled to the intervening clock dividing elements having an enable control, to correctly provide inputs to the replicated intervening clock dividing elements.

Figure 13:
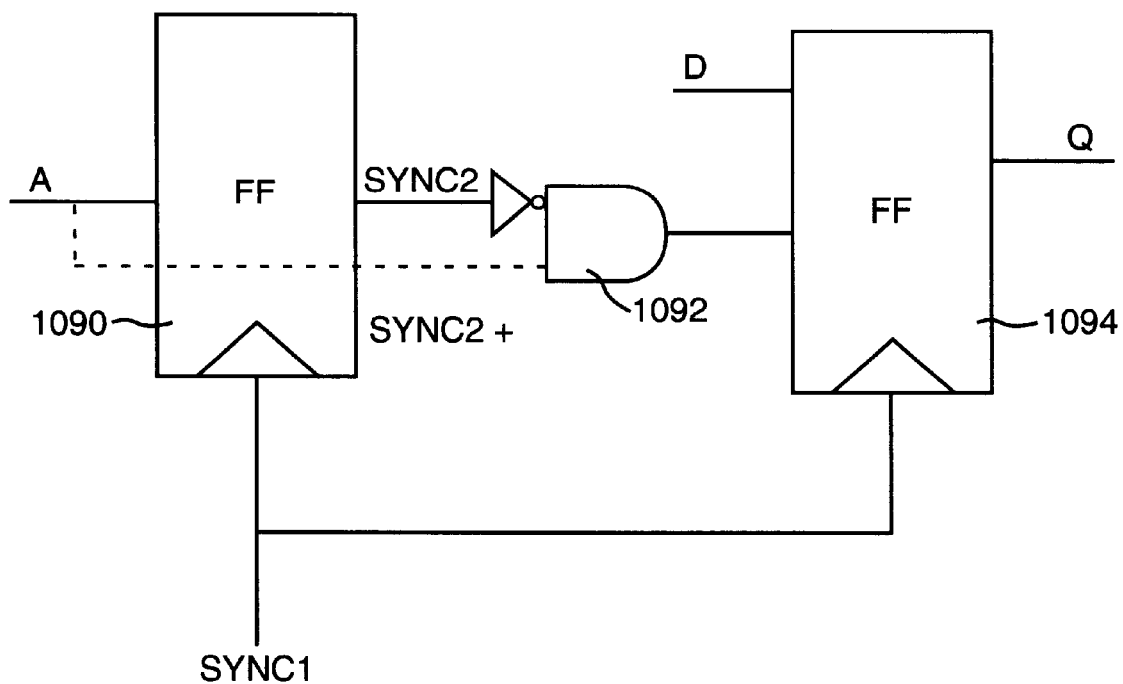

FIG. 13 illustrates the transformed flip-flop for the simple clock dividing timing hazard case illustrated in FIG. 3b, wherein the register 1026 is an edge trigger flip-flop. Recall from FIG. 3b, the clock dividing combinatorial logic is null, thus the replicated clock dividing combinatorial logic is also null. Since the outputting flip-flop 1090 did not have an enable control, its next state (SYNC2+) is provided directly to the replicated null clock dividing combinatorial logic. Next, AND gate 1092 is provided to generate the logical AND of inverted SYNC2 and SYNC2+. Since the original flip-flop did not have an enable control, the output of AND gate 1092 is provided to transformed flip-flop 1094 as enable control without "qualification". Finally, undivided clock SYNC1 is coupled to the clock input of transformed flip-flop 1094.

Figure 22:
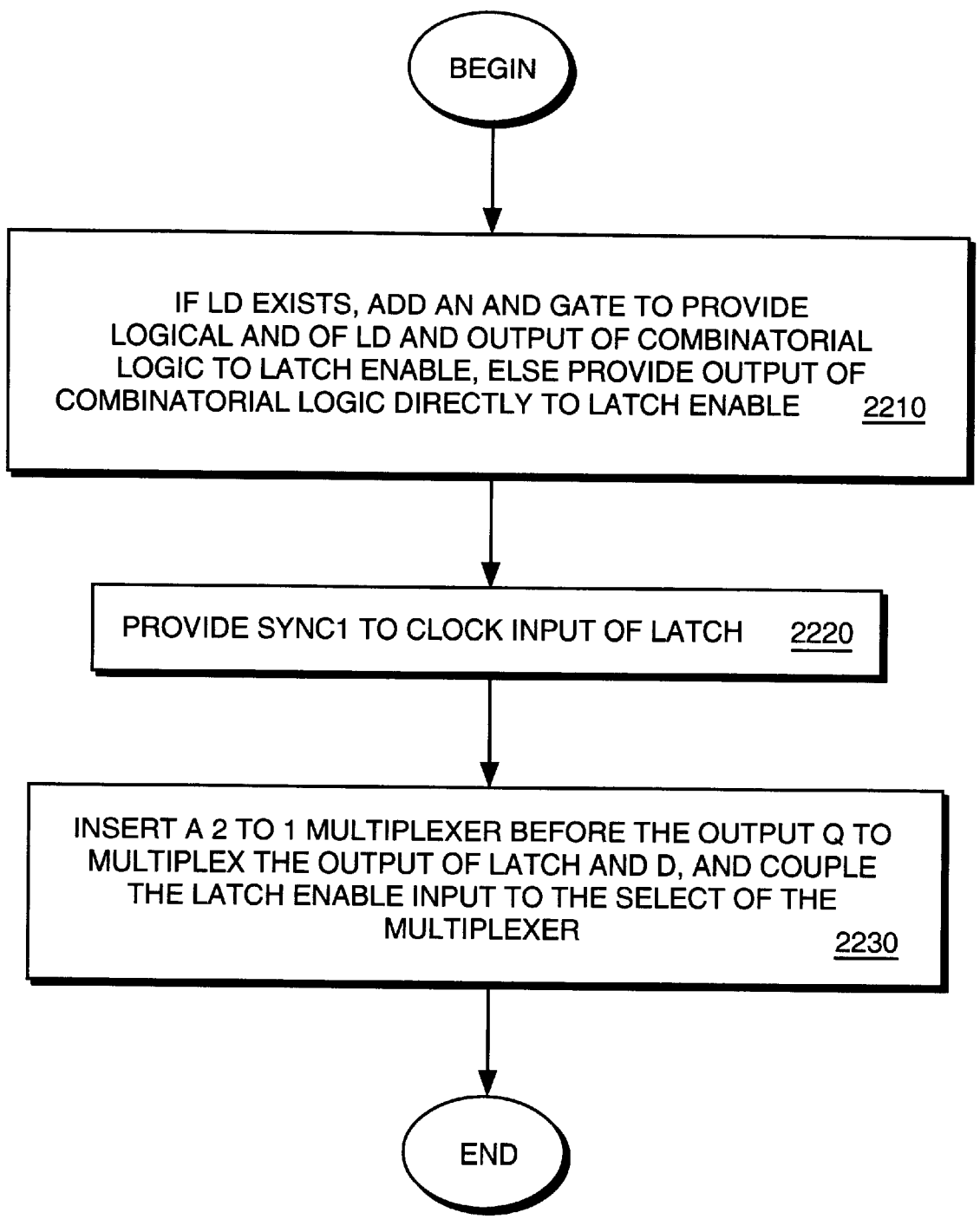
FIGS. 22–24 illustrate one embodiment of the clock division timing hazard resolution method steps for level sensitive registers.
Figure 23:
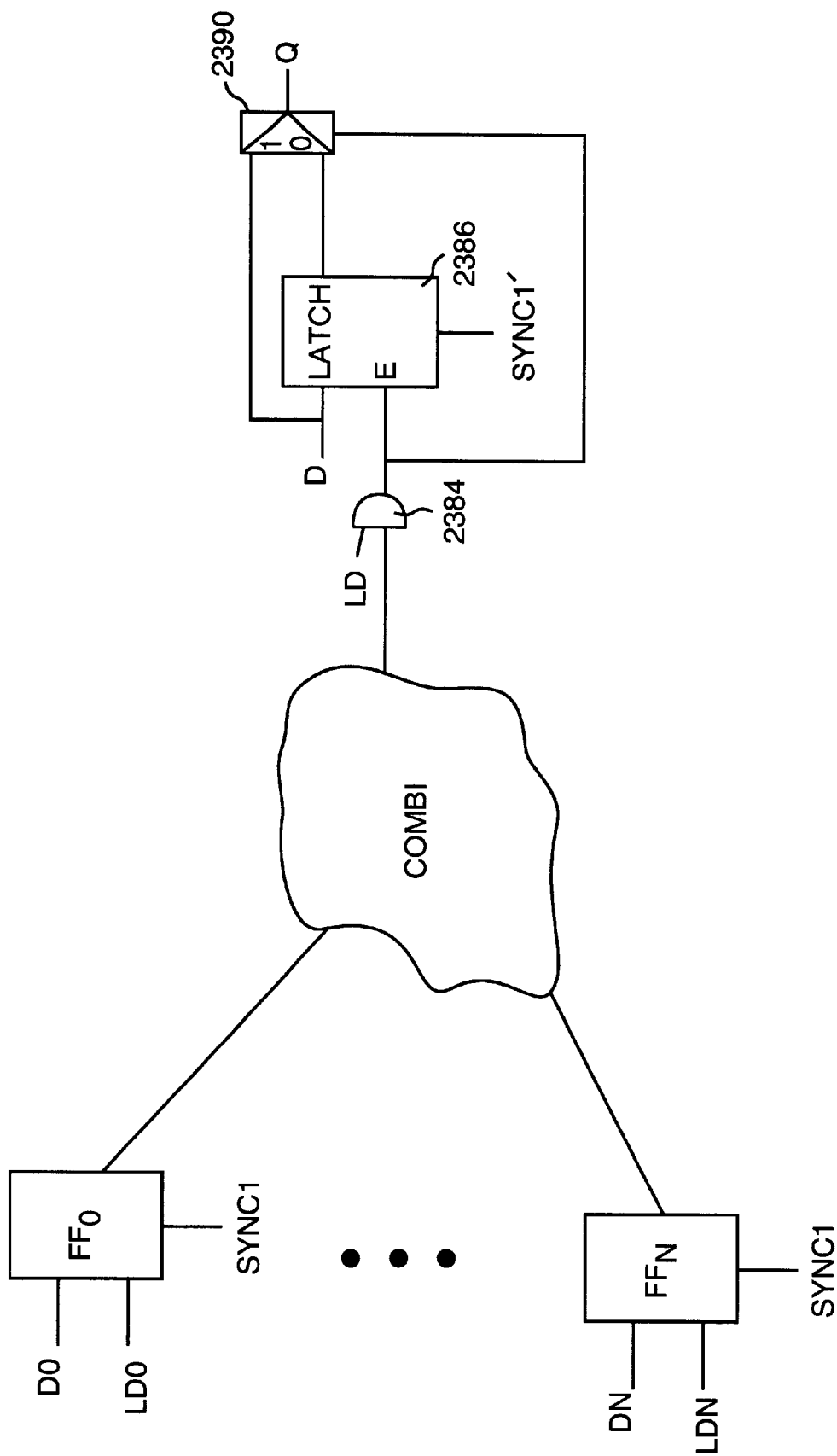
Figure 24:
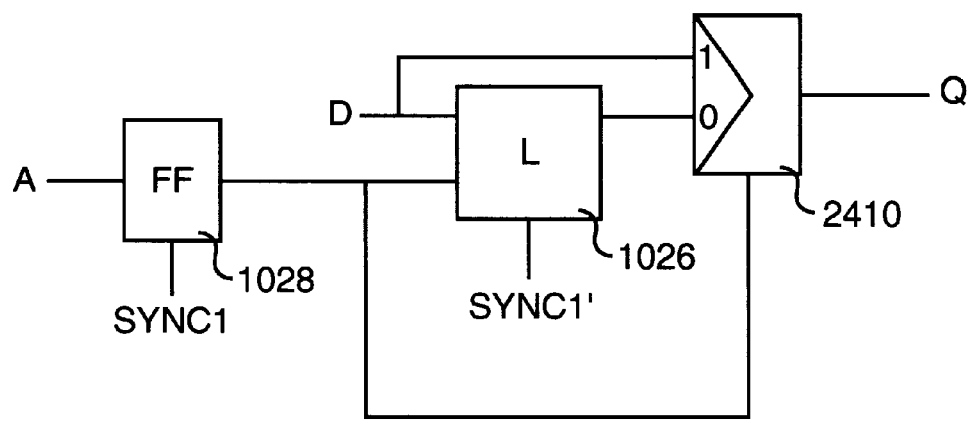

Skipping now to FIGS. 22–24, which illustrate the transformation steps performed by one embodiment of timing hazard remover 1000 to resolve a clock division timing hazard for a level sensitive latch. As shown in FIG. 22–23, in step 2210, if latch 2386 includes an enable input LD, timing hazard remover 1000 adds AND 2384 to provide the logical AND of LD and the output of the combinatorial logic to the enable input of latch 2386. If latch 2386 does not include enable input LD, timing hazard remover 1000 provides the output of the combinatorial logic directly to the enable input of latch 2386. In step 2220, timing hazard remover 1000 provides the logical invert of SYNC1 (notation: SYNC1') to the clock input of latch 2386. Next, in step 2230, timing hazard remover 1000 inserts 2 to 1 multiplexer 2390 to select between the output of latch 2386 and the input D, wherein the enable input of latch 2386 is tied to the select of multiplexer 2390.

In sum, timing hazard remover 1000 resolves clock division timing hazards by transforming each latch controlled by a divided clock into a latch control by the invert of the "parent" undivided clock and a complementary enable control. Timing hazard remover 1000 further inserts an AND gate into the circuit design to qualify the complementary enable control with the enable signal LD. Lastly, timing hazard remover 1000 inserts a multiplexer to select between the output of the latch and the input of the latch based on the input to the latch enable.

FIG. 24 illustrates the transformation of the simple clock dividing timing hazard illustrated in FIG. 3b, wherein the register 1026 is a level sensitive latch. Recall from FIG. 3b that the combinatorial logic is null and that the register 1026 had no enable input signal LD. Therefore, the output of the dividing flip-flop 1028 can be provided directly to the enable input of register 1026. SYNC1', the logical invert of SYNC1, is provided directly to register 1026. Multiplexer 2410 selects between the output of register 1026 and the input D based on the value provided to the enable input of register 1026.

Figure 25:
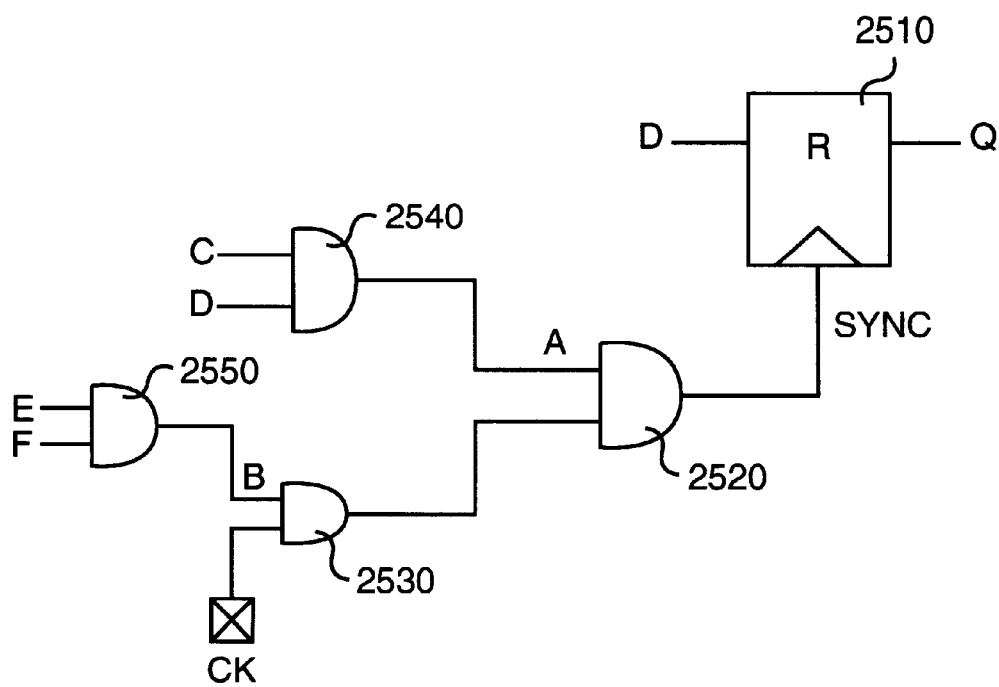
FIG. 25 illustrates an example gated clock timing hazard from which only clock gating elements are extracted.
Figure 26:
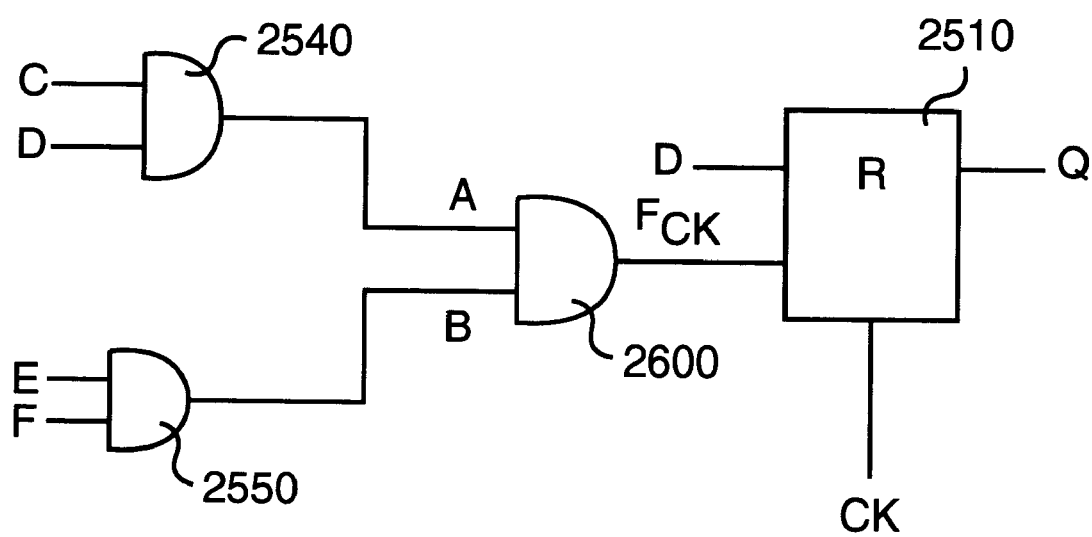
FIG. 26 illustrates the transformed register from FIG. 25.

FIGS. 25–29 illustrate some examples of gated clock and divided clock timing hazards and their transformations. In FIG. 25, register 2510 has a gated clock. As discussed above for FIG. 7, timing hazard remover 1000 first extracts the clock gating elements between SYNC and the design source clock. In the illustrated example, AND gates 2520 and 2530 are between SYNC and the design source clock. Gates 2540 and 2550 are not elements between SYNC and the design source clock and are therefore not included in the Boolean function F. Therefore, F=A AND (B AND CK). Fckn=F(CK=0)=0 and Fck=F(CK=1)=A AND B. A AND B is indeterminate X in the table in FIG. 8. {0,X} is case 7. Case 7 is the same transformation for both edge trigger and level sensitive registers as shown in FIGS. 9g and 19g. The transformed register is shown in FIG. 26, wherein the gated timing hazard has been removed. Fck is provided to the enable input using AND 2600. Signals A and B are generated by their respective gates just as in FIG. 25.

Figure 27:
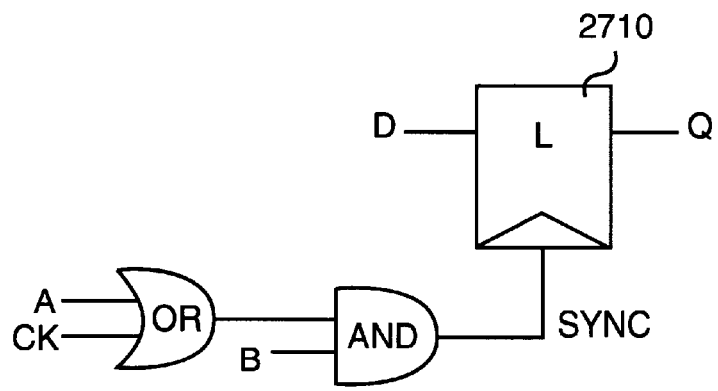
FIGS. 27–29 illustrate a case 9 transformation for a level sensitive register.
Figure 28:
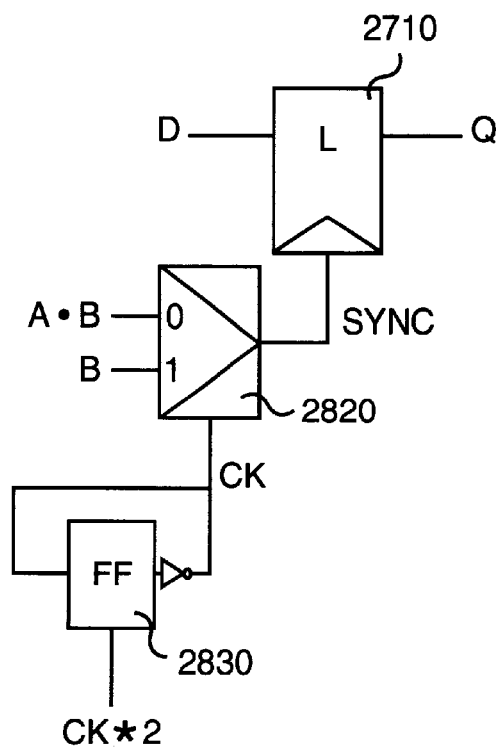

FIG. 27 illustrates a simple example of the most complicated gated clock transformation, and FIG. 28 illustrates the resulting divided clock hazard. Latch 2710 has a gated clock timing hazard. The Boolean function F equals (A OR Ck) AND B. When B is 0, SYNC equals zero, and Q provides the latched value. When B is 1 and A is 1, SYNC equals 1, and Q follows D. When B is one, and A is zero, Q follows D when Ck is high. $F_{ckn}$ equals A and B, which is an indeterminate X. $F_{ck}$ equals B, which is also an indeterminate X. {X, X} is case 9 from FIG. 8. As discussed above, case 9 cannot be resolved as a gated clock timing hazard. Rather, the latch is transformed into an equivalent latch with a divided clock timing hazard, as shown in FIG. 28. A generated clock that is twice as fast as the design source clock is provided to flip-flop 2830 and divided to provide a clock signal having the same frequency as the design source clock. Therefore, the same functionality could be obtained by providing the design source clock directly to the select line on multiplexer 2820. In other words, flip-flop 2830 may not serve any functional purpose in the design and may be merely provided so that timing hazard remover 1000 will recognize it as a divided clock timing hazard.

Figure 29:
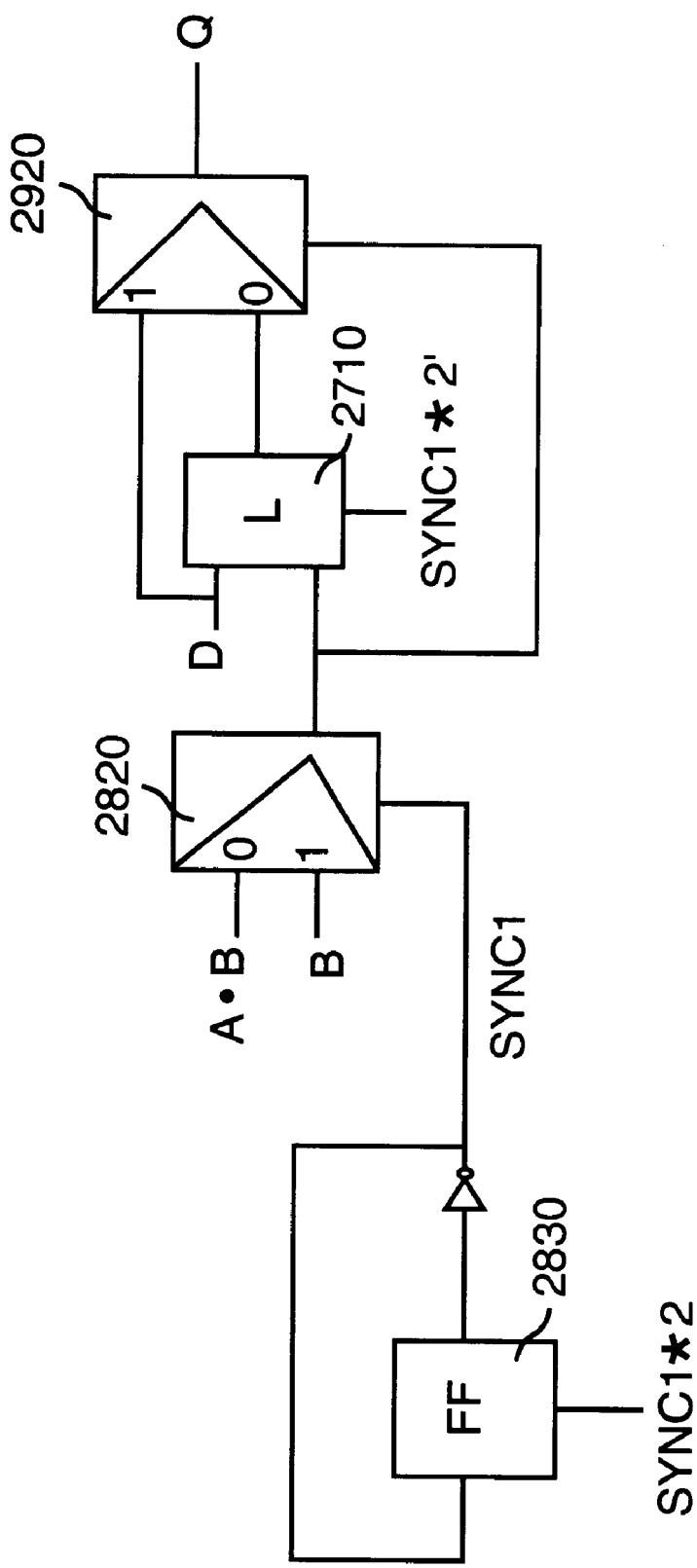

The resulting divided clock timing hazard of FIG. 28 is resolved using the general divided clock timing hazard transformation shown in FIGS. 22 and 23. FIG. 29 shows the resulting transformation of the level sensitive latch wherein the timing hazard has been removed and multiplexer 2920 has been added.

Having described the timing hazard remover of the present invention in detail, we now proceed to describe a particular adaptation of the present invention in a hardware emulation system, referencing FIGS. 14–18. Obviously, other adaptations are possible, and will be apparent to those skilled in the art.

Figure 14:
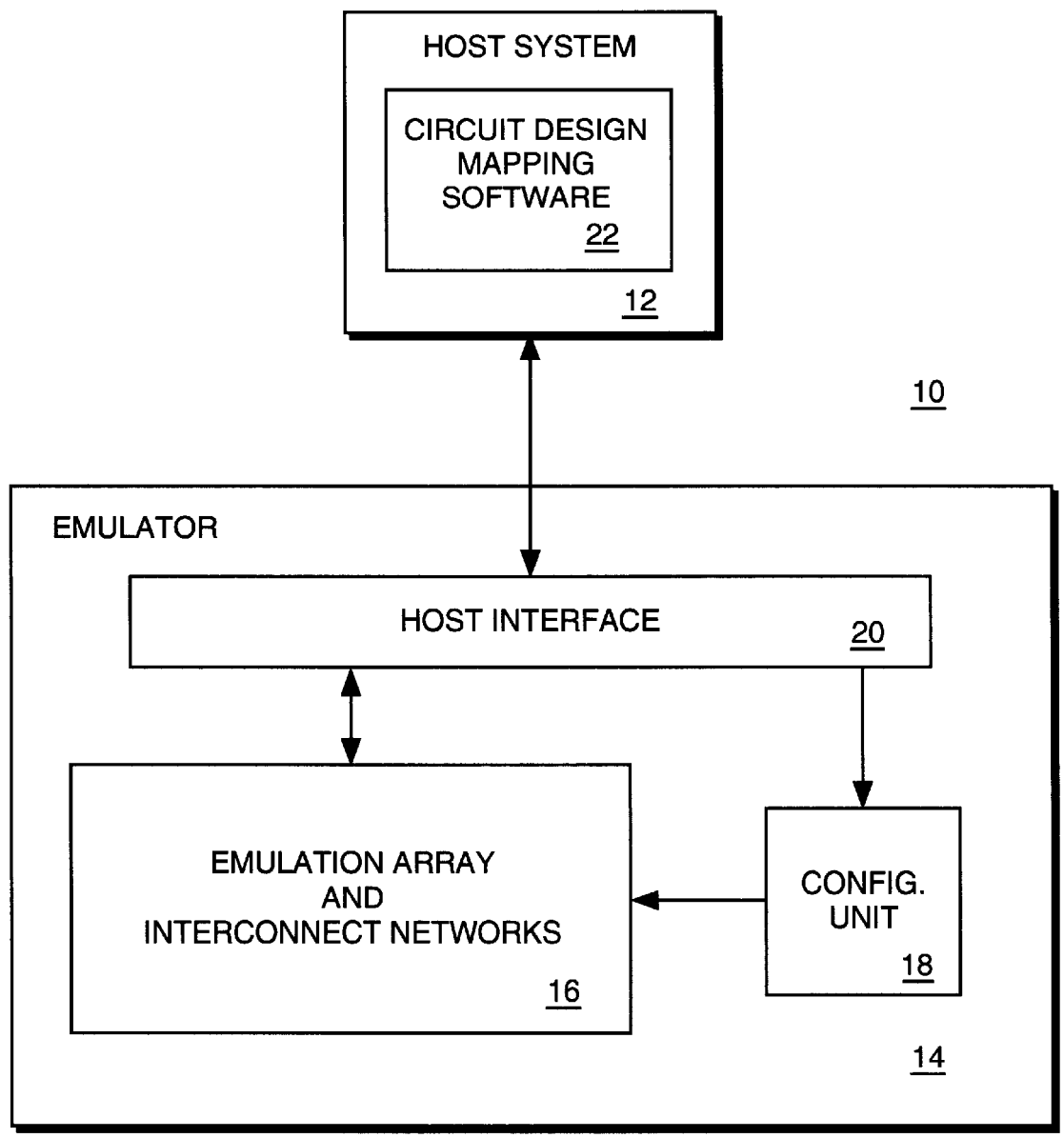
FIG. 14 illustrates a hardware emulation system incorporated with the teachings of the present invention.

FIG. 14 is a block diagram showing the hardware emulation system having the timing hazard remover of the present invention adapted therein. As illustrated, emulation system 10 includes host system 12 and emulator 14. Host system 12 includes in particular circuit design mapping software 22, whereas emulator 14 includes in particular emulation array and interconnect networks 16, a configuration unit 18 and host interface 20 coupled to each other as shown.

Emulation array and interconnect networks 16 perform the conventional function of "realizing" and emulating a circuit design. Circuit design mapping software 22 performs the conventional function of mapping a circuit design onto emulator 14 for emulation, configuring emulator array and interconnect networks 16 through host interface 20 and configuration unit 18. However, for the illustrated embodiment, circuit design mapping software 22 incorporates timing hazard remover of the present invention, allowing circuit design mapping software 22 to automatically remove timing hazards from a circuit design, before compiling and mapping the circuit design onto emulation array and interconnect networks 16. In other words, host system 12 is programmed with logic for resolving timing hazards as an integral part of programming host system 12 with circuit design mapping software 22.

Except for the logic for resolving timing hazards, host system 12 including the base functions of circuit design mapping software 22, and emulator 14, are intended to represent a broad category the respective elements found in conventional emulation systems.

Figure 15:
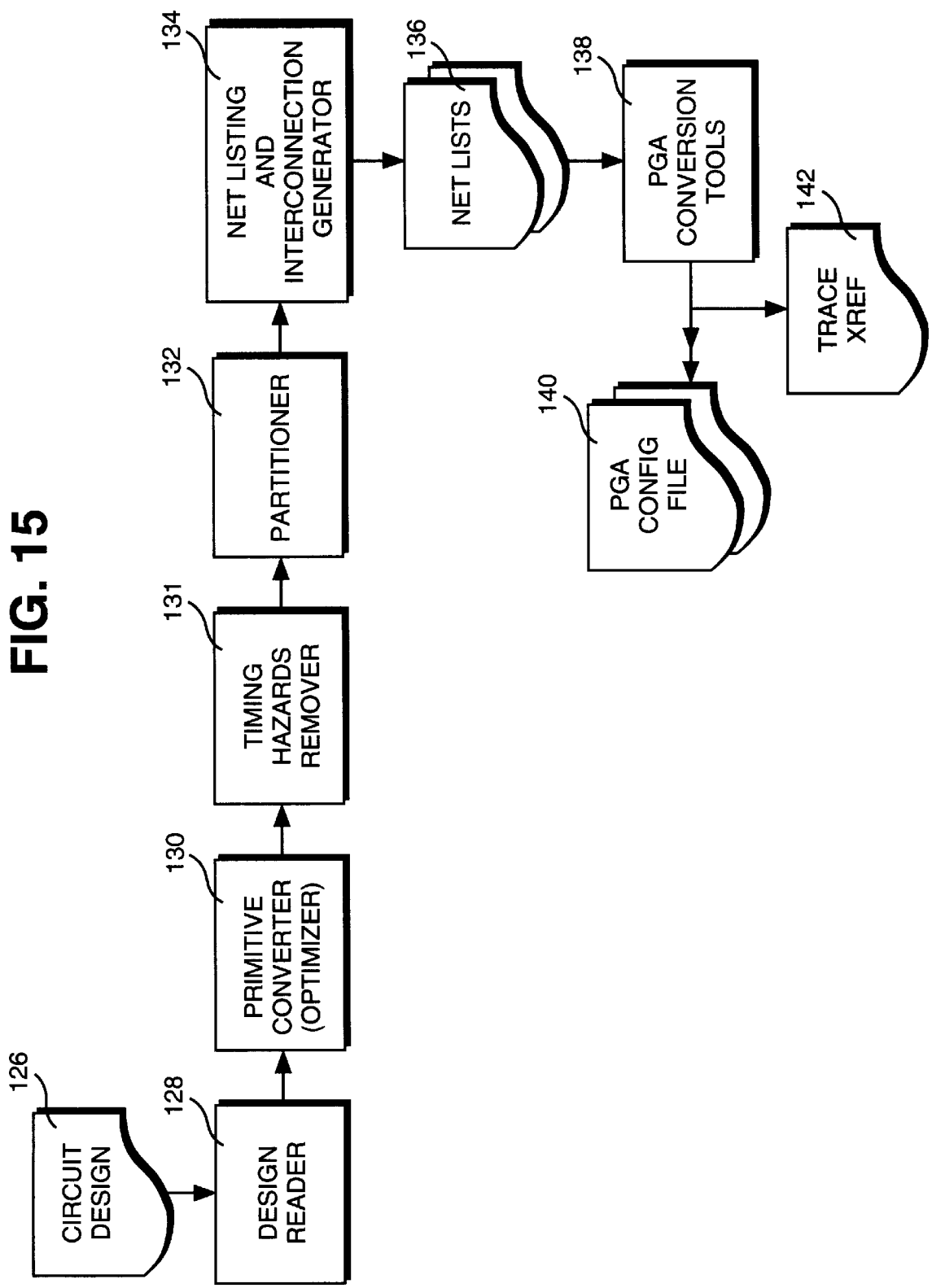
FIG. 15 illustrates one embodiment of the mapping software of FIG. 14 in further detail.

FIG. 15 illustrates circuit design mapping software 22, and the general flow of programming emulation system 10 in further detail. As shown, circuit design mapping software 22 includes design reader 128, primitive converter 130, timing hazard remover 131, partitioner 132, net listing interconnection generator 134 and PGA conversion tool 138. Circuit design 126 is processed by design reader 128, primitive converter 130, timing hazard remover 131, partitioner 132, and netlisting and interconnection generator 134 to generate netlists 136, which in turn is processed by PGA conversion tools 138 to generate PGA configuration files 140 and trace xref files 142. PGA configuration files 140 are then used to configure emulator 14 to "realize" circuit design 126 on emulator 14.

In one embodiment, primitive converter 130 includes an optimizer (not shown) for optimizing the circuit design 126. Most importantly, timing hazard remover 131 automatically resolves clock gating as well as clock division timing hazard in circuit design 126, recursively if there are multiple levels of timing hazards, as described earlier. As a result, when the transformed circuit is "realized" on emulator 14, circuit design 126 can be emulated with the assurance that timing hazards will not be encountered.

Figure 16:
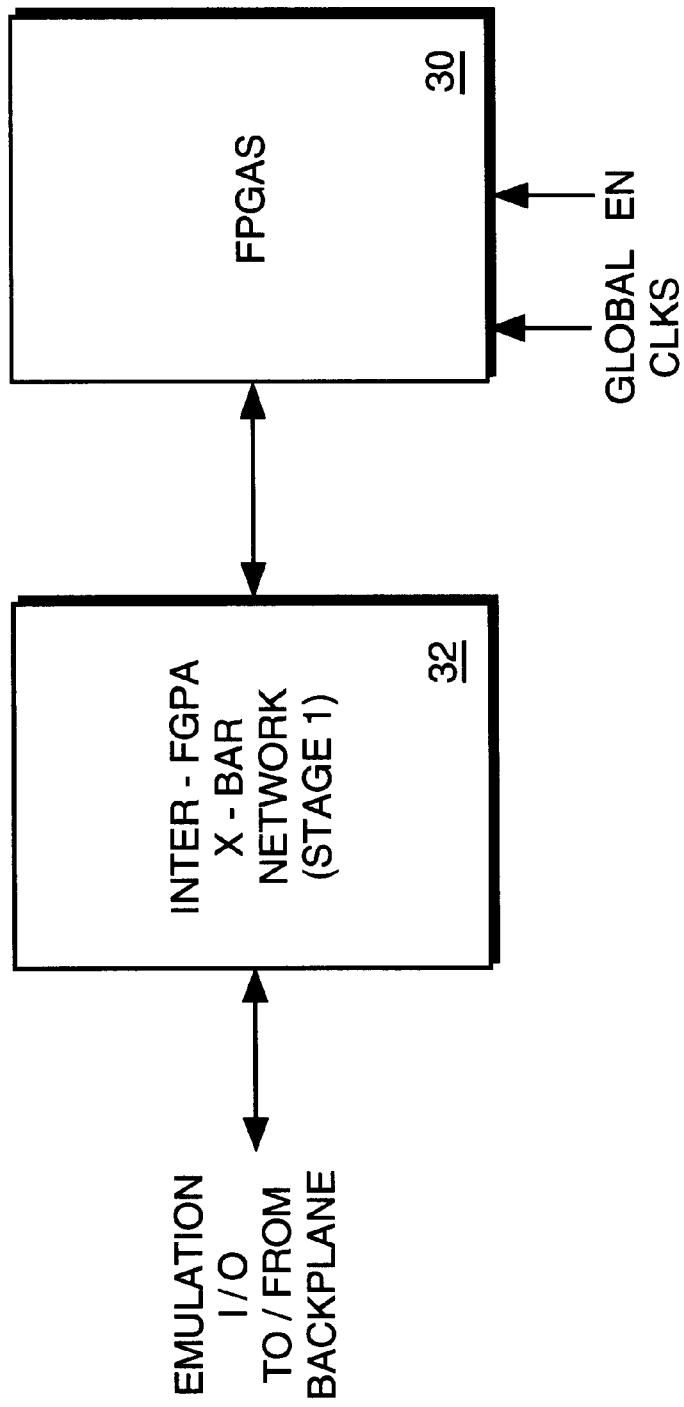
FIGS. 16–18 illustrate one embodiment of the emulator of FIG. 14 in further detail.
Figure 17:
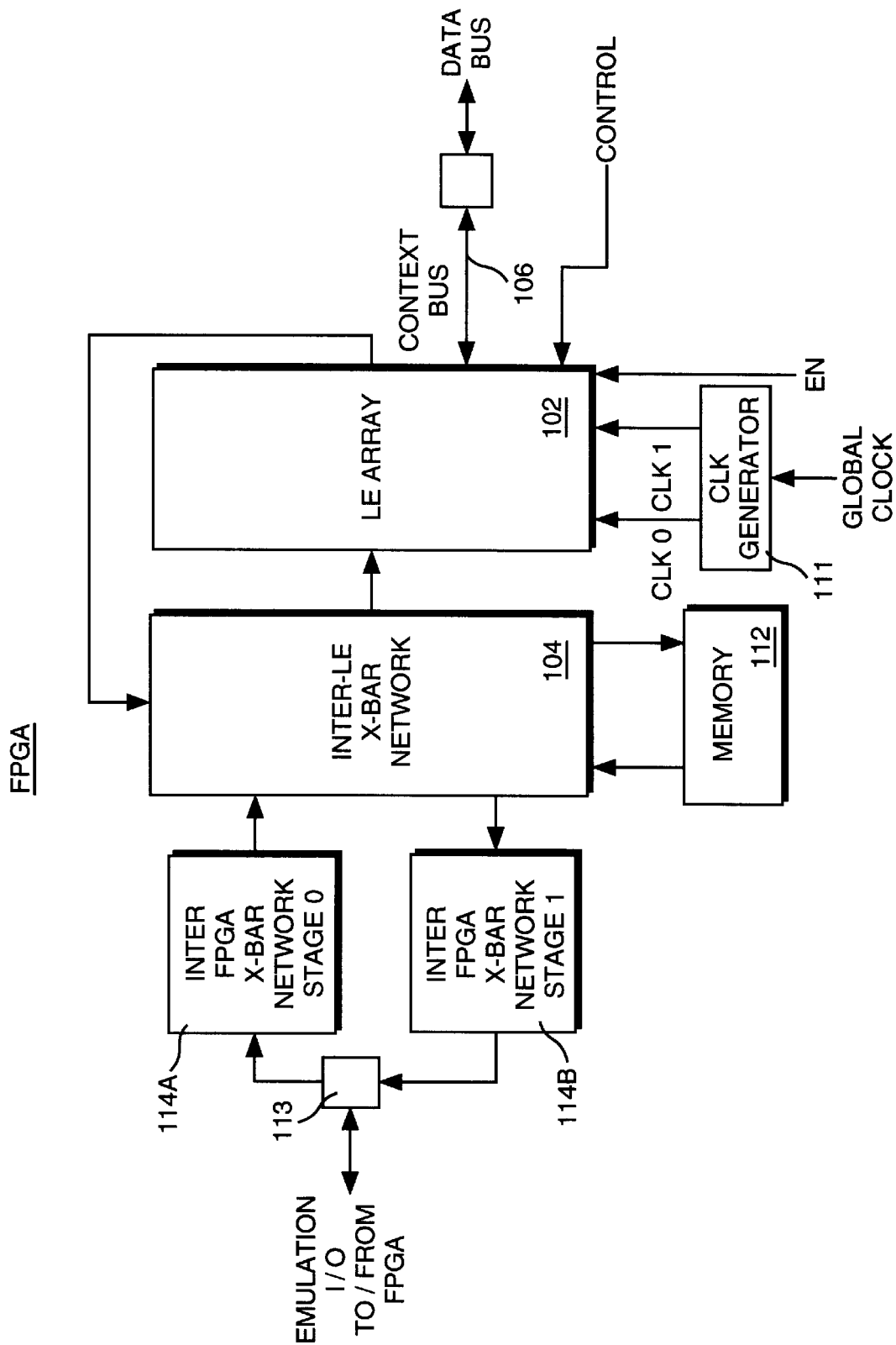
Figure 18:
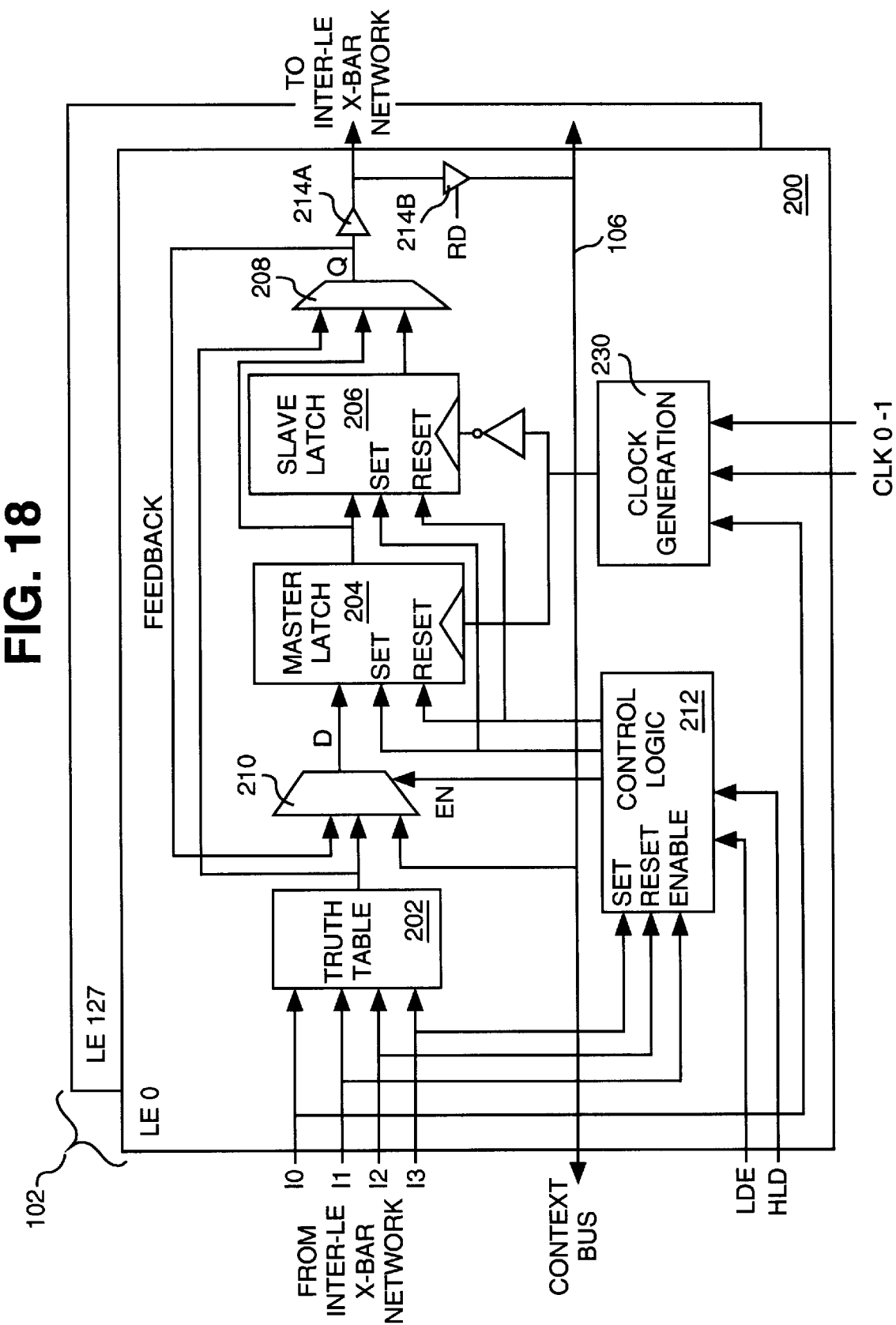

FIGS. 16–18 illustrate one embodiment of emulation array and interconnect networks 16 in further detail. Emulator array and interconnect networks 16 are distributively disposed on a number of logic boards 26, electrically connected to each other through an inter-logic board crossbar (x-bar) network (not shown) disposed in backplane (not shown), forming a single crate (not shown). In one embodiment, a crate includes six logic boards 26. As shown in FIGS. 16–17, each logic board 26 comprises a plurality of FPGAs 30 and inter-FPGA x-bar network (stage 1) 32 coupled to each other. For the illustrated embodiment, FPGAs includes 24 FPGAs, and inter-FPGA x-bar stage 1 32 also "doubles" as interlogic board x-bar network stage 0, thereby requiring only inter-logic board x-bar network stage 1 (not shown) to be disposed on backplane. As shown in FIG. 17, each FPGA includes LE array 102 having multiple reconfigurable LEs, inter-LE crossbar (or x-bar) network 104, and I/O pins 113. For the illustrated embodiment, each FPGA has 64 I/O pins 113. Each of I/O pins 113 can be statically configured to be either an input or an output pin. This static configuration can be accomplished in any of a wide variety of conventional manners, such as by way of a configuration register. Additionally, each FPGA also includes inter-FPGA x-bar network (stage 0 and stage 1) 114a–114b. In other words, inter-FPGA x-bar network (stage 1) 114b is actually distributively disposed on-chip inside each FPGA.

As in the prior art, LEs 102 are used to emulate circuit elements of a circuit design to be "realized" for emulation. Inter-LE x-bar network 104 interconnects the LEs within a single FPGA and the I/O pins of the FPGA. Inter-FPGA x-bar network stages 0 and 1 114a–114b and 32 in turn interconnect FPGAs of a logic board 26 to each other, and to the logic board's interconnections to the backplane. In other words, LEs 102 are interconnected with a scaleable multi-level multi-stage x-bar network topology. This interconnection topology is described in detail in copending application, Ser. No. 08/542,519, entitled "An Emulation System Employing A Multi-Level Multi-Stage Network Topology For Interconnecting Reconfigurable Logic Elements", assigned to the assignee with the present invention, which is hereby fully incorporated by reference.

Preferably, as shown for the illustrated embodiment, each FPGA also includes memory 112 and context bus 106. Memory 112 facilitates usage of the FPGA to emulate circuit design with memory elements. For the illustrated embodiment, memory 112 uses 8-bit input and 8-bit output. Context bus 106 facilitates individual initialization and observation of the LEs. An FPGA including these and other useful debugging features is disclosed in copending application, Ser. No. 08/542,830, entitled "A Field Programmable Gate Array with Integrated Debugging Facilities", assigned to the assignee of the present invention, which is also hereby fully incorporated by reference.

Each FPGA of FPGAs 30 is provided with a global clock signal, i.e. the same clock signal for all logic boards 26, and an enable signal (EN). Furthermore, each FPGA further includes a clock generator 111 for generating at least a master clock (Clk0) and a "doubled" (or x2) master clock (Clk1) for the LE array 102, using the provided global clock. In one embodiment, an additional clock can be calculated and provided to the LE array in order to generate an inverted master clock.

FIG. 18 illustrates one embodiment of LEs 102 in further detail. As shown, for the illustrated embodiment, each LEs 102 include 128 reconfigurable LEs 200. Each reconfigurable LE 200 includes a multiple input—single output truth table 202, a pair of master-slave latches 204–206, output multiplexer 208, input multiplexer 210, control logic 212, and clock signal generation circuitry 230. The enumerated elements are coupled to each other as shown.

Truth table 202 is used to generate a predetermined output in response to a set of inputs. For the illustrated embodiment, truth-table 202 has 4 inputs and 1 output. In other words, depending on the inputs, truth table 202 outputs 1 of $2^4$ of predetermined outputs. Each of master-slave latches 204–206 is used to store an input value synchronously with its clock input. Furthermore, each of master-slave latches 204–206 can be asynchronously forced to one or zero depending on the values of set and reset. For the illustrated embodiment, the set and reset inputs are provided using the inputs 13 and 12 of truth table 202.

Output multiplexer 208, input multiplexer 210 and control logic 212 are used to control the manner in which truth table 202 and master-slave latches 204–206 are used. Output multiplexer 208 allows either the output of truth table 202 (by-passing master-slave latches 204–206) or the output of slave latch 206 (for level sensitive designs), or the output of master latch 204 (for edge sensitive designs) to be selected for output. The by-passed output is selected if truth table 202 is to be used standalone. When either the output of master or slave latch 204 or 206 is selected, input multiplexer 210 allows either the output of truth table 202, the feedback from output multiplexer 208, or an input value on context bus 106 to be provided to master-slave latches 204–206. The feedback value is selected to "freeze" LE 200, and the bus value is selected to initialize LE 200. Thus, master/slave latches 204–206 operating in conjunction with multiplexer 210 may be configured to function as illustrated in FIG. 6b.

Control logic 212 controls input multiplexer 210 and the set and reset values provided to master-slave latches 204–206, in accordance to a set, a reset, an ENAB, a load (LDE) and a hold (HLD) value provided. Clock signal generation circuitry 230 is used to selectively provide one of a number of clock signals for master-slave latches 204–206. Clock signal generation circuitry 230 generates the localized clock signal using selected ones of Clk0, Clk1, and a calculated clock from input 10. In other words, the localized clock signals provided to master-slave latches 204–206 are generated by circuitry integrated with each LE 200 using inputs generated by the "on-chip" clock generator 111 or other LEs. Furthermore, the inter-board, inter-FPGA, and inter-LE clock skew is ensured to be smaller than the minimum propagation time between any two registers in emulation array and interconnect network 16. Hence, there are no race conditions (short paths) between registers clocked by such signals. Lastly, LE 200 also includes buffer 214a for outputting the selected output to inter-LE X-bar network 104 and buffer 214b for outputting the selected output onto context bus 106 for direct observation outside each FPGA.

In sum, truth table 202 may be used in a standalone manner, or in conjunction with the corresponding master-slave latches 204–206. Enhanced LE 200 is suitable for "level sensitive" as well as "edge sensitive" circuit design emulations. Additionally, beside the "normal" current output of truth table 202, each LE 200 can be individually initialized. Each LE 200 can also be caused to output the same output over and over again, as if it is frozen. Furthermore, LEs 200 are individually and directly observable outside each FPGA. In other words, there are no "hidden nodes". The state of each "node" is directly observable outside the FPGA, without requiring the reconfiguration and time consuming re-compilation of circuit design mappings normally performed under the prior art.

Thus, a method and apparatus for removing timing hazards in a circuit design has been described. While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus comprising:

an execution unit for executing programs;

a storage unit coupled to said execution unit, and having stored therein a program for execution by said execution unit during operation, wherein when executing, the program enables the apparatus to identify certain level sensitive storage circuit elements in a circuit design, said certain level sensitive storage circuit elements being controlled by synchronization signals that can cause timing hazards by virtue of potential timing skews between delays of these synchronization signals with respect to a reference signal of the circuit design, said potential skews not being ensured to be within a design tolerance limit, the synchronization signals being generated by gating combinatorial logic based on at least the reference signal; and the program further enables the apparatus to automatically transform said certain level sensitive storage circuit elements to be controlled by synchronization signals with potential skews ensured to be within the design tolerance limit, without altering functionality of the circuit design, thereby removing the timing hazards that can be caused, the program determining the appropriate transformations for each of said certain level sensitive storage circuit elements employing a Boolean function corresponding to the gating combinatorial logic, and determining at least a first and a second co-factor value of a logical decomposition of the synchronization signal using the corresponding Boolean function.

2. The apparatus as set forth in claim 1, wherein the apparatus is enabled by the program to automatically transform said certain level sensitive storage circuit elements controlled by the gated synchronization signals to be controlled by either the reference signal, a constant signal or a divided version of the reference signal multiplied by two, in conjunction with a complementary enable control signal, if appropriate.

3. The apparatus as set forth in claim 2, wherein the apparatus is enabled by the program to determine the appropriate transformation for one of said level sensitive storage circuit elements controlled by a gated synchronization signal, using the Boolean function corresponding to the gating combinatorial logic, and factoring into consideration whether the pre-transformation level sensitive storage circuit element has an enable control signal or not.

4. The apparatus as set forth in claim 1, wherein the apparatus is enabled by the program to represent each of the Boolean functions using a canonical representation.

5. The apparatus as set forth in claim 2, wherein the apparatus is also enabled by the program to insert an AND gate into the circuit design to qualify a complementary enable signal, if employed and the pre-transformation level sensitive storage circuit element has an enable control signal.

6. An apparatus comprising:

an execution unit for executing programs;

a storage unit coupled to said execution unit, and having stored therein a program for execution by said execution unit during operation, wherein when executing, the program enables the apparatus to identify certain level sensitive storage circuit elements in a circuit design, said certain level sensitive storage circuit elements being controlled by synchronization signals that can cause timing hazards by virtue of potential timing skews between delays of these synchronization signals with respect to a reference signal of the circuit design, said potential skews not being ensured to be within a design tolerance limit, the synchronization signals being generated by divisional combinatorial logic based on at least the reference signal; and the program further enables the apparatus to automatically transform said certain level sensitive storage circuit elements to be controlled by synchronization signals that have potential skews which are ensured to be within the design tolerance limit, without altering functionality of the circuit design, thereby removing the timing hazards that can be caused.

7. The apparatus as set forth in claim 6, wherein the apparatus is enabled by the program to provide the divided synchronization signal as a complementary enable control signal.

8. The apparatus as set forth in claim 7, wherein the apparatus is also enabled by the program to insert an AND gate in the circuit design to qualify the divided synchronization signal by an enable signal of the level sensitive storage circuit element.

9. The apparatus as set forth in claim 7, wherein the apparatus is also enabled by the program to provide a multiplexer to select one of an output of the level sensitive storage circuit element and an input of the level sensitive storage circuit element based on the complementary enable control signal.

10. A computer system comprising:

an execution unit for executing programs;

a storage unit coupled to said execution unit, and having stored therein a program for execution by said execution unit during operation, wherein when executing, the program enables the computer system to identify certain level sensitive storage circuit elements in a circuit design, said certain level sensitive storage circuit elements being controlled by synchronization signals that can cause timing hazards by virtue of potential timing skews between delays of these synchronization signals with respect to a reference signal of the circuit design, said skews not being ensured to be within a design tolerance limit, the synchronization signals being generated by gating combinatorial logic based on at least the reference signal; and the program further enables the computer system to automatically transform said certain level sensitive storage circuit elements to be controlled by synchronization signals that have potential skews which are ensured to be within the design tolerance limit, without altering functionality of the circuit design, thereby removing the timing hazards that can be caused, the program determining the appropriate transformation for each of said certain level sensitive storage circuit elements employing a Boolean function corresponding to the gating combinatorial logic, and determining at least a first and a second co-factor value of a logical decomposition of the synchronization signal using the corresponding Boolean function.

11. The computer system as set forth in claim 10, wherein
the computer system is enabled by the program to automatically transform said certain level sensitive storage circuit elements controlled by the gated synchronization signals to be controlled by either the reference signal, a constant signal or a divided version of the reference signal multiplied by two, in conjunction with a complementary enable control signal, if appropriate.

12. A computer system comprising:

an execution unit for executing programs;

a storage unit coupled to said execution unit, and having stored therein a program for execution by said execution unit during operation, wherein when executing, the program enables the computer system to identify certain level sensitive storage circuit elements in a circuit design, said certain level sensitive storage circuit elements being controlled by synchronization signals that can cause timing hazards by virtue of potential timing skews between delays of these synchronization signals with respect to a reference signal of the circuit design, said skews not being ensured to be within a design tolerance limit, the synchronization signals being generated by division combinatorial logic based on at least the reference signal; and the program further enables the computer system to automatically transform said certain level sensitive storage circuit elements to be controlled by synchronization signals that have potential skews which are ensured to be within the design tolerance limit, without altering functionality of the circuit design, thereby removing the timing hazards that can be caused.

13. A computer system comprising:

an execution unit for executing programs;

a storage unit coupled to said execution unit, and having stored therein a program for execution by said execution unit during operation, wherein when executing, the program enables the computer system to identify certain level sensitive storage circuit elements in a circuit design, said certain level sensitive storage circuit elements being controlled by synchronization signals that can cause timing hazards by virtue of potential timing skews between delays of these synchronization signals with respect to a reference signal of the circuit design, said potential timing skews not being ensured to be within a design tolerance limit, the synchronization signals being generated by either gating or division combinatorial logic based on at least the reference signal; and the program further enables the computer system to automatically transform said certain level sensitive storage circuit elements to be controlled by synchronization signals that have potential skews which are ensured to be within the design tolerance limit, without altering functionality of the circuit design, thereby removing the timing hazards that can be caused, the program first transforming the level sensitive storage circuit elements controlled by synchronization signals generated by gating combinatorial logic, then organizing the remaining ones of the level sensitive storage circuit elements controlled by synchronization signals generated by division combinatorial logic into logical levels, and transforming the remaining ones of the level sensitive storage circuit elements recursively, one logical level at a time.

14. A hardware emulation system comprising:

a host system having an execution unit for executing programs, and a storage unit coupled to said execution unit, and having stored therein a program for execution by said execution unit during operation, wherein when executing, the program enables the host system to map a circuit design onto logic and interconnect elements of the hardware emulation, including identification of certain level sensitive storage circuit elements in the circuit design, said certain level sensitive storage circuit elements being controlled by synchronization signals that can cause timing hazards by virtue of potential timing skews between delays of said these synchronization signals with respect to a reference signal of the circuit design, said potential timing skews not being ensured to be within a design tolerance limit, the synchronization signals being generated by gating combinatorial logic based on at least the reference signal;

the program further enables the host system to automatically transform said certain level sensitive storage circuit elements to be controlled by synchronization signals that have potential skews which are ensured to be within the design tolerance limit, without altering functionality of the circuit design, thereby removing the timing hazards that can be caused, the program determining the appropriate transformation for each of said certain level sensitive storage circuit elements employing a Boolean function corresponding to the gating combinatorial logic, and determining at least a first and a second co-factor value of a logical decomposition of the synchronization signal using the corresponding Boolean function; and said logic and interconnect elements for emulating said circuit design.

15. The hardware emulation system as set forth in claim 14, wherein the host system is enabled by the program to automatically transform the level sensitive storage circuit elements controlled by the gated synchronization signals to be controlled by either the reference signal, a constant signal or a divided version of the reference signal multiplied by two, in conjunction with a complementary enable control signal, if appropriate.

16. A hardware emulation system comprising:

a host system having an execution unit for executing programs, and a storage unit coupled to said execution unit, and having stored therein a program for execution by said execution unit during operation, wherein when executing, the program enables the host system to map a circuit design onto logic and interconnect elements of the hardware emulation system, including identification of certain level sensitive storage circuit elements in the circuit design, said certain level sensitive storage circuit elements being controlled by synchronization signals that can cause timing hazards by virtue of potential timing skews between delays of these synchronization signals with respect to a reference signal of the circuit design, said potential timing skews not being ensured to be within a design tolerance limit, the synchronization signals being generated by division combinatorial logic based on at least the reference signal;

the program further enables the host system to automatically transform said certain level sensitive storage circuit elements to be controlled by synchronization signals that have potential skews which are ensured to be within the design tolerance limit, without altering functionality of the circuit design, thereby removing the timing hazards that can be caused; and said logic and interconnect elements for emulating said circuit design.

17. A hardware emulation system comprising:

a host system having an execution unit for executing programs, and a storage unit coupled to said execution unit, and having stored therein a program for execution by said execution unit during operation, wherein when executing, the program enables the host system to map a circuit design onto logic and interconnect elements of the hardware emulation system, including identification of certain level sensitive storage circuit elements in the circuit design, said certain level sensitive storage circuit elements being controlled by synchronization signals that can cause timing hazards by virtue of potential timing skews between delays of these synchronization signals with respect to a reference signal of the circuit design, said potential skews not being ensured to be within a design tolerance limit, the synchronization signals being generated by either gating or division combinatorial logic based on at least the reference signal;

the program further enables the host system to automatically transform said certain level sensitive storage circuit elements to be controlled by synchronization signals that have potential skews which are ensured to be within the design tolerance limit, without altering functionality of the circuit design, thereby removing the timing hazards that can be caused, the program first transforming the level sensitive storage circuit elements controlled by synchronization signals generated by gating combinatorial logic, then organizing the remaining ones of the level sensitive storage circuit elements controlled by synchronization signals generated by division combinatorial logic into logical levels, and transforming the remaining ones of the level sensitive storage circuit elements recursively, on e logical level at a time; and said logic and interconnect elements for emulating said circuit design.

18. An automate d method for removing timing hazards from a circuit design; said method comprising the steps of:

a) identifying level sensitive storage circuit elements controlled by synchronization signals that are generated by gating combinatorial logic based on at least a reference signal of the circuit design;

b) determining Boolean functions corresponding to the gating combinatorial logic, and determining a first and a second cofactor value of a logical decomposition of each of the gated synchronization signals using the corresponding Boolean function; and c) automatically transforming each of said level sensitive storage circuit elements controlled by the gated synchronization signals to be controlled by either the reference signal, a constant signal or a divided version of the reference signal multiplied by two, in conjunction with a complementary enable control signal, if appropriate, based at least in part on the first and the second co-factor values determined.

19. The method as set forth in claim 18, wherein said step (c) includes factoring into consideration whether a pre-transformation level sensitive storage circuit element has an enable control signal or not.

20. The method as set forth in claim 18, wherein step (b) includes constructing each of the Boolean functions using a reduced order binary decision diagram.

21. The method as set forth in claim 18, wherein step (c) includes inserting an AND gate into the circuit design to qualify the complementary enable signal, if employed and a pre-transformation level sensitive storage circuit element has an enable control signal.

22. An automated method for removing timing hazards from a circuit design, said method comprising the steps of:

(a) identifying a level sensitive storage circuit element controlled by a synchronization signal that is generated by division combinatorial logic based on at least a reference signal of the circuit design;

(b) automatically transforming said level sensitive storage circuit element from being controlled by the divided synchronization signal to be being controlled by a reference signal in conjunction with a complementary enable control signal.

23. The method as set forth in claim 22, wherein step (b) further includes providing the divided synchronization signal as the complementary enable control signal.

24. The method as set forth in claim 23, wherein step (b) further includes inserting an AND gate in the circuit design to qualify the divided synchronization signal by an enable signal of the level sensitive storage circuit element.

25. The method as set forth in claim 22, wherein step (b) further includes providing a multiplexer to select one of an output of the level sensitive storage circuit element and an input of the level sensitive storage circuit element based on the complementary enable control signal.

* * * * *

UNITED STATES PATENT AND TRADEMARK OFFICE
CERTIFICATE OF CORRECTION

PATENT NO. : 6,301,553 B1
DATED : October 9, 2001
INVENTOR(S) : Luc M. Burgun and Frederic M. Emirian It is certified that error appears in the above-identified patent and that said Letters Patent is hereby corrected as shown below:

<u>Column 8,</u>
Line 12, "{X, 056" should read -- {X, 0} --.

<u>Column 19,</u>
Line 37, "on e logical" should read -- one logical --.
Line 41, "automate d" should read -- automated --.

Signed and Sealed this

Fifteenth Day of October, 2002

*Attest:*

*Attesting Officer*

JAMES E. ROGAN
*Director of the United States Patent and Trademark Office*